(12) United States Patent
Retschke et al.

(10) Patent No.: US 6,770,866 B2
(45) Date of Patent: Aug. 3, 2004

(54) DIRECT PATTERN WRITER

(75) Inventors: Wolfgang Retschke, Jena (DE); Wolfgang Senf, Jena (DE); Yigal Katzir, Rishon-Lezion (IL)

(73) Assignee: Laser Imaging Systems GmbH & Co. KG, Jena (DE)

(*) Notice: Subject to any disclaimer, the term of this patent is extended or adjusted under 35 U.S.C. 154(b) by 316 days.

(21) Appl. No.: 10/038,061

(22) Filed: Jan. 3, 2002

(65) Prior Publication Data

US 2002/0141024 A1 Oct. 3, 2002

Related U.S. Application Data

(60) Provisional application No. 60/259,587, filed on Jan. 4, 2001.

(51) Int. Cl.[7] .................................................. H01J 3/14
(52) U.S. Cl. .................................. 250/235; 250/559.29
(58) Field of Search ................................. 250/235, 236, 250/559.29, 559.22; 359/202, 216, 217; 369/44.27, 44.29, 44.18; 347/233, 235, 250; 355/53

(56) References Cited

U.S. PATENT DOCUMENTS

| | | | |
|---|---|---|---|
| 3,447,856 A | | 6/1969 | De Lange |
| 4,205,348 A | | 5/1980 | DeBenedictis et al. |
| 4,940,310 A | * | 7/1990 | Hamada ............... 250/236 |
| 4,947,047 A | | 8/1990 | Muraki |
| 5,264,872 A | | 11/1993 | Wong |
| 5,309,178 A | | 5/1994 | Gross |
| 5,327,338 A | | 7/1994 | Allen et al. |
| 5,386,221 A | | 1/1995 | Allen et al. |
| 5,426,433 A | | 6/1995 | Gertel |
| 5,574,537 A | | 11/1996 | Ozawa |
| 6,037,967 A | | 3/2000 | Allen et al. |
| 6,275,514 B1 | | 8/2001 | Katzir et al. |

FOREIGN PATENT DOCUMENTS

| | | |
|---|---|---|
| GB | 2 245 790 | 1/1992 |
| WO | WO 00/02424 | 1/2000 |
| WO | WO 00/11766 | 3/2000 |
| WO | WO 00/55592 | 9/2000 |

OTHER PUBLICATIONS

"Design and Fabricationof Acousto–OpticDevices;" pp. 94–122; Edited by Goutzoulis, A. P. et al; Marcel Dekker, Inc.; 1994.

Lowry,J. B. et al.; "Pulsed Scophony Laser Projection System;" pp. 255–258; Oct. 1988; Optics and Laser Technology; vol. 20; No. 5.

* cited by examiner

*Primary Examiner*—Que T. Le
(74) *Attorney, Agent, or Firm*—Sughrue Mion, PLLC

(57) ABSTRACT

Apparatus for scanning a beam across a surface including a scanner scanning a pulsed laser beam across a surface and a position indicator receiving an input from the pulsed laser beam at a plurality of locations across the surface, and outputting position indications indicating a position of said pulsed laser beam along said surface. The position indications are used to modulate data in apparatus for exposing patterns on surfaces, for example electrical circuit patterns on photosensitized surfaces. One use of such apparatus is the manufacture of electrical circuits.

27 Claims, 27 Drawing Sheets

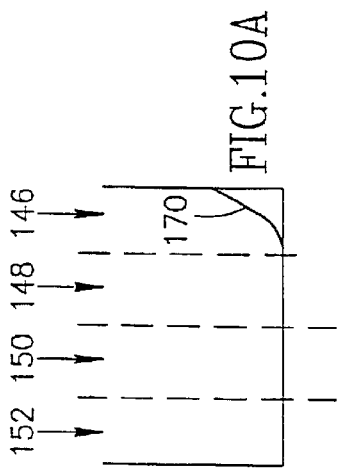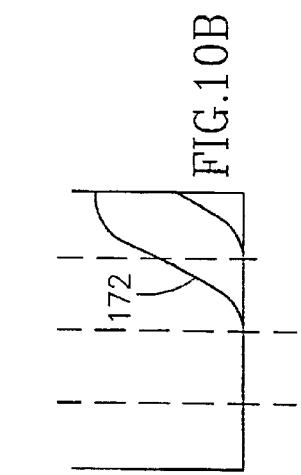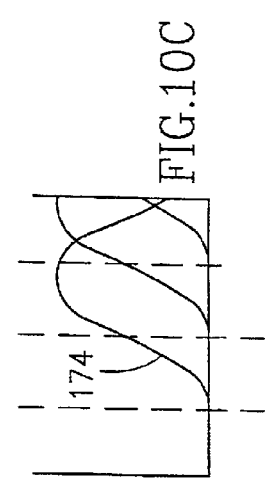
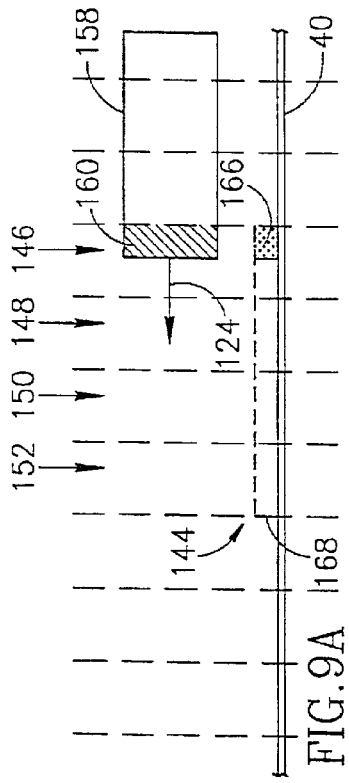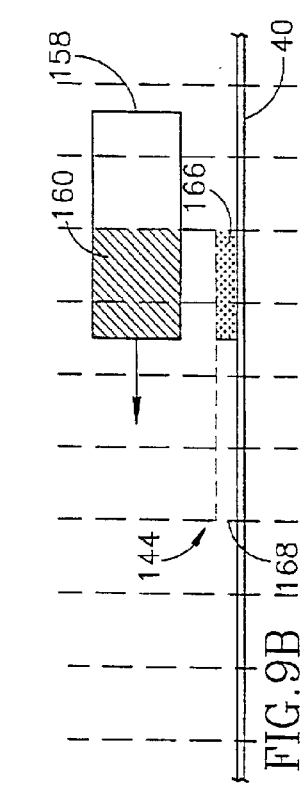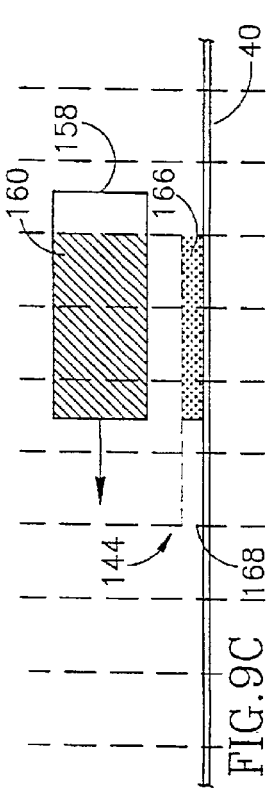
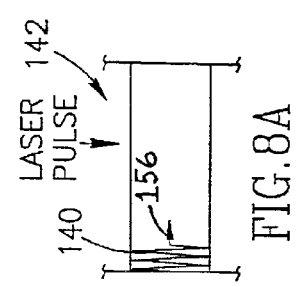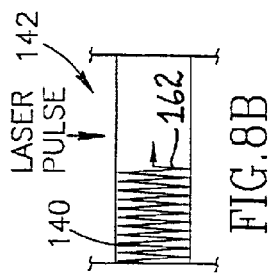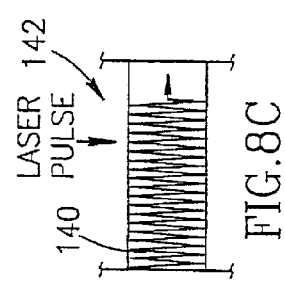

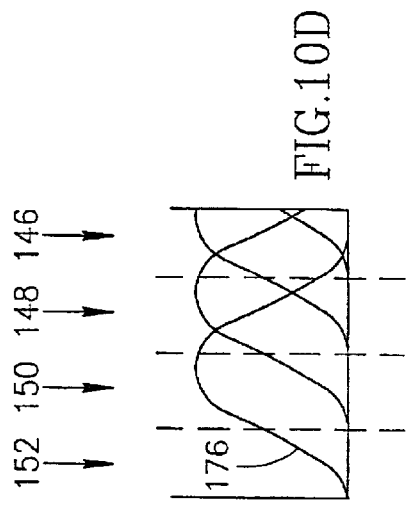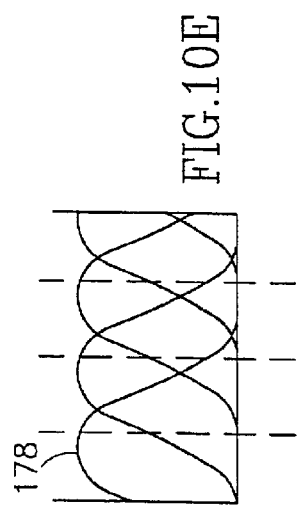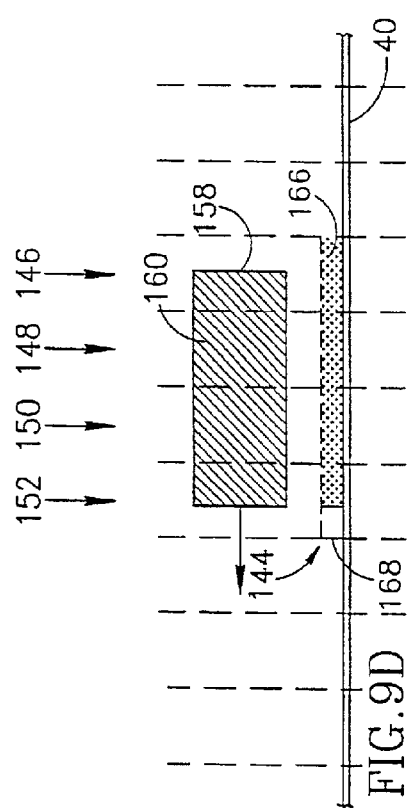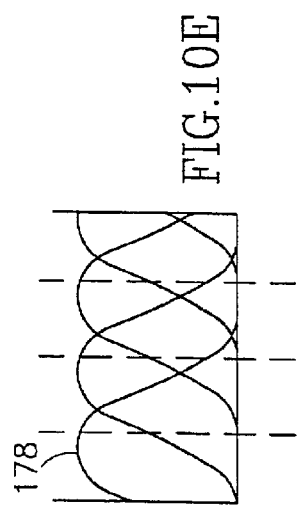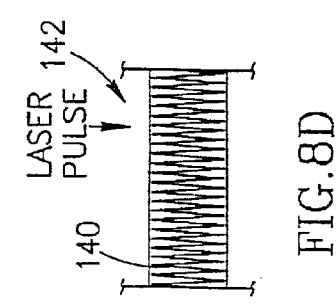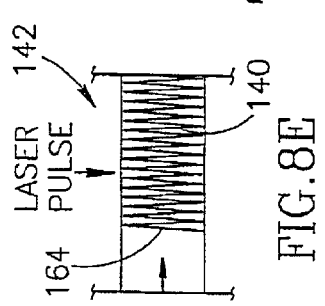

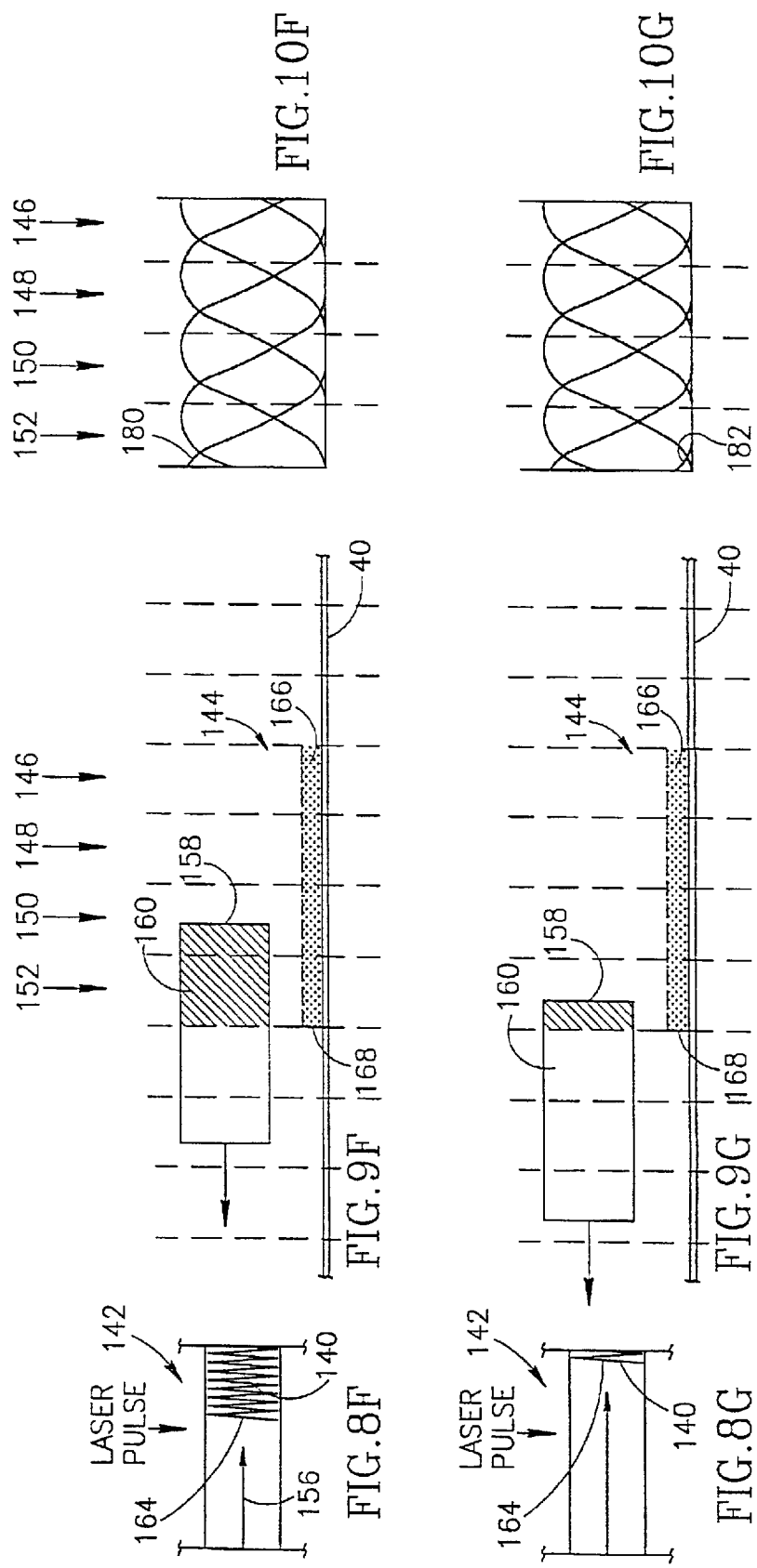

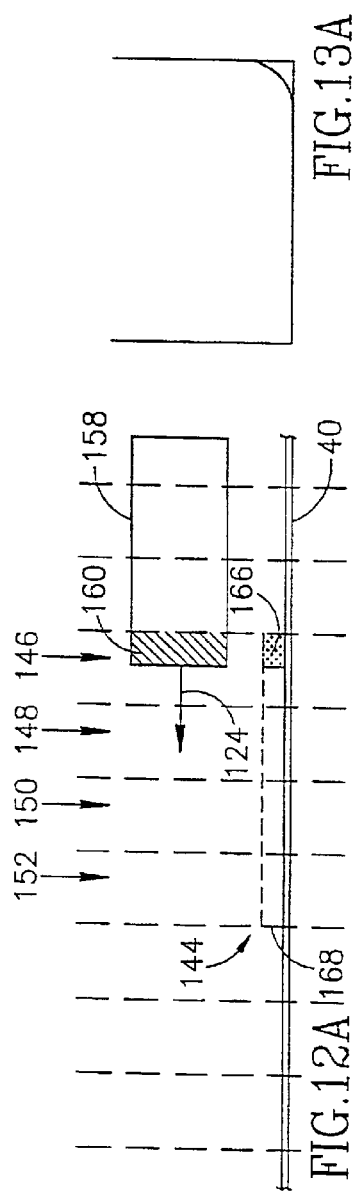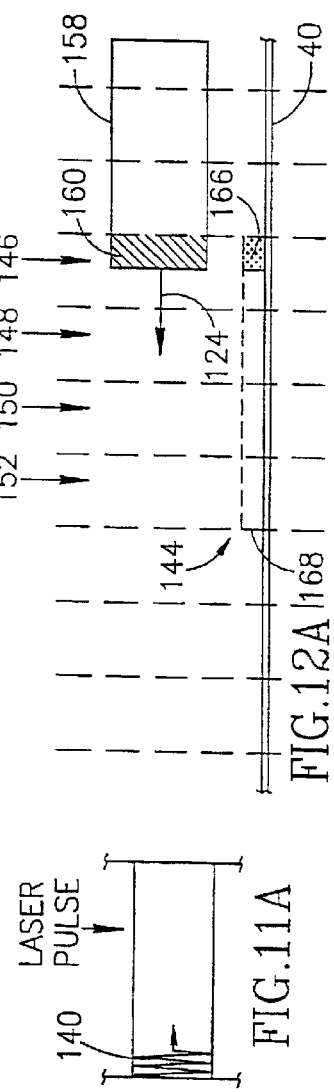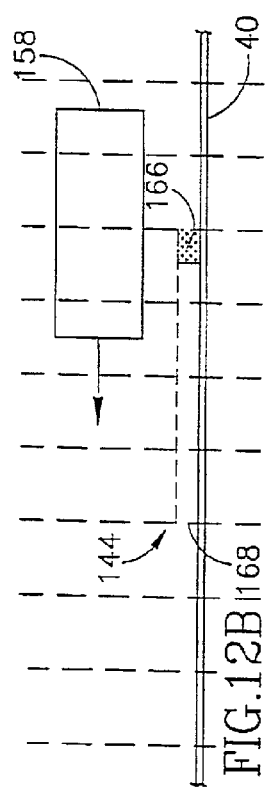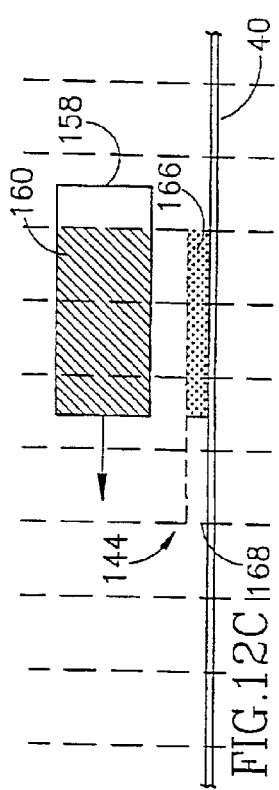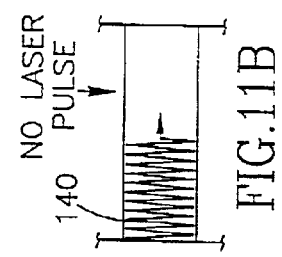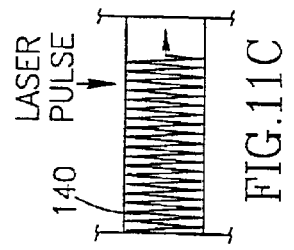

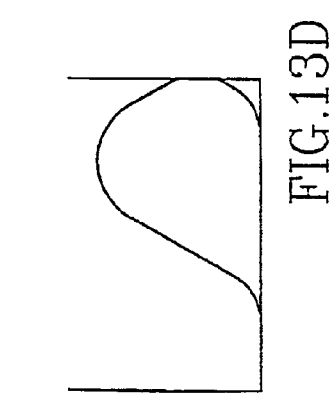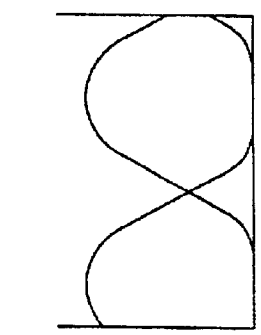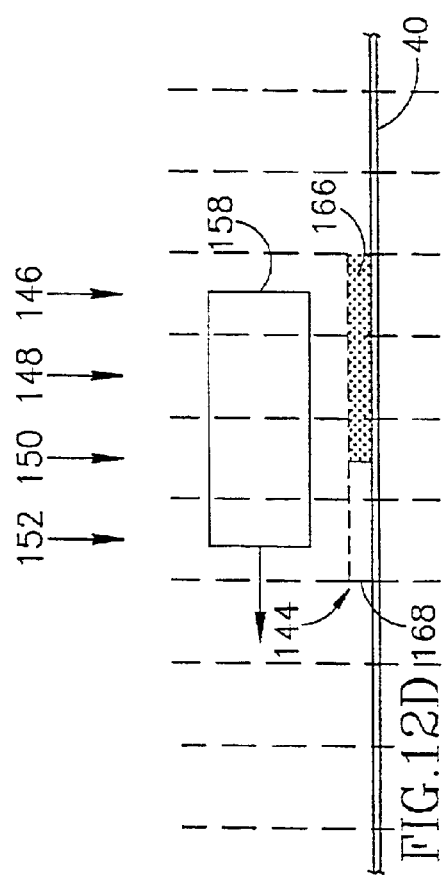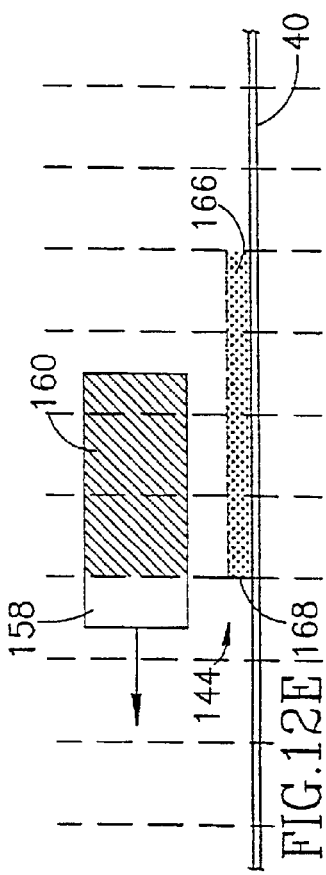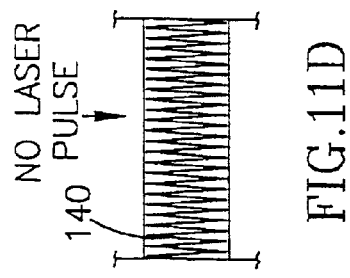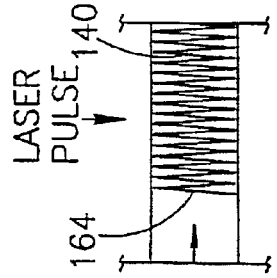

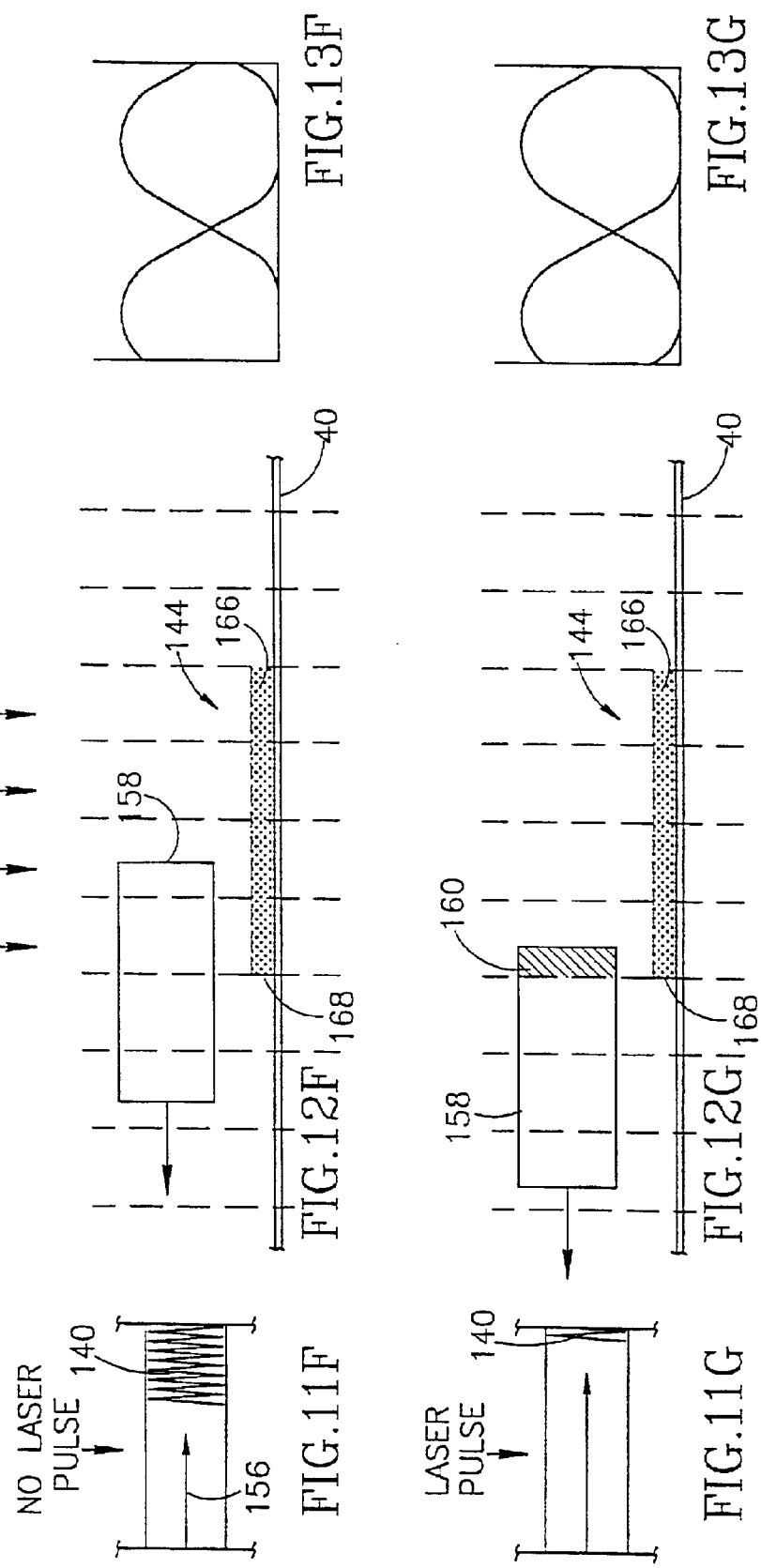

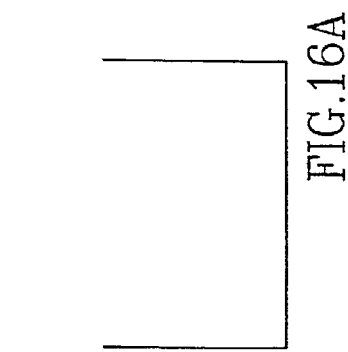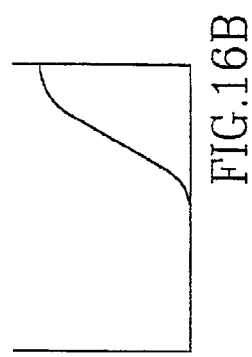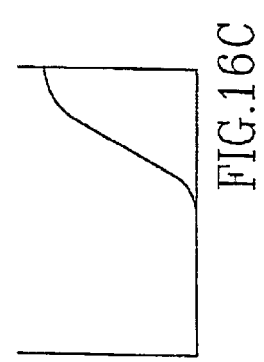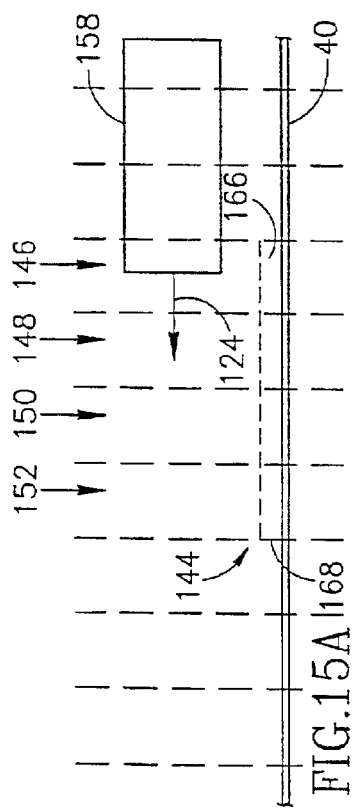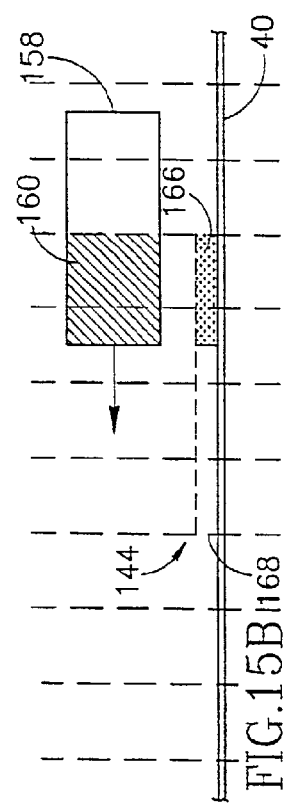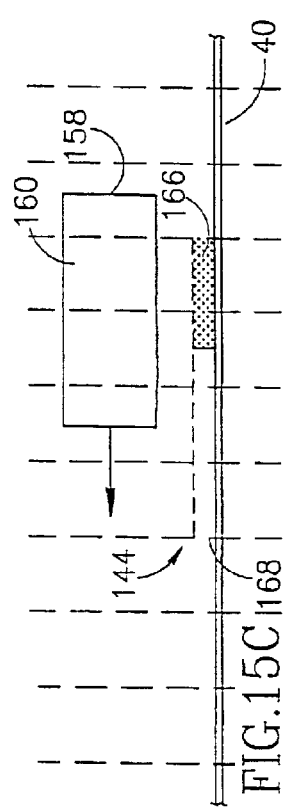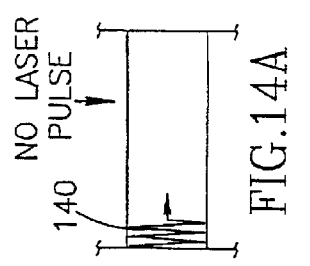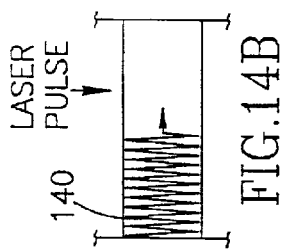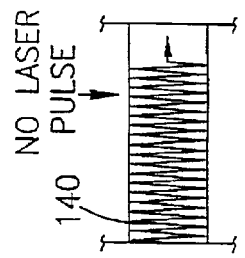

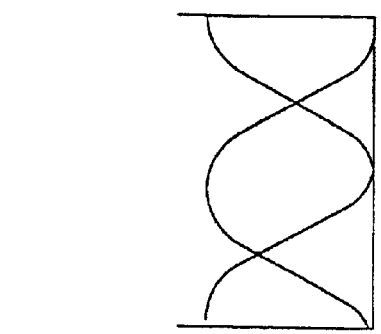
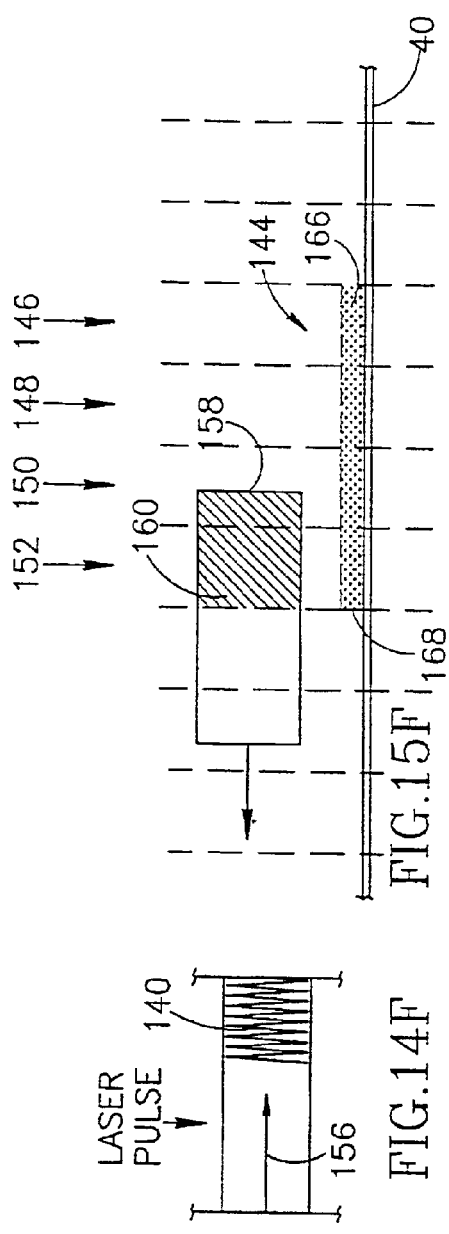
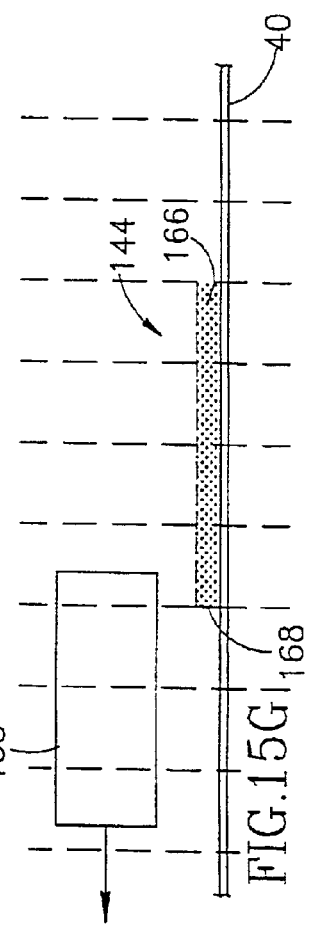
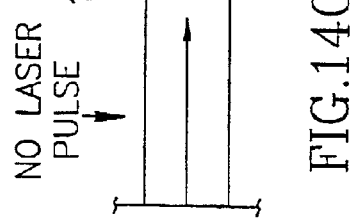

DIRECT PATTERN WRITER

CROSS REFERENCE TO RELATED APPLICATIONS

This application claims the benefit of U.S. Provisional Application No. 60/259,587 filed on Jan. 4, 2001, which is incorporated by reference in its entirety.

FIELD OF THE INVENTION

The invention relates to devices for writing patterns using pulsed light beams in general, and of mode locked lasers in particular. An important application of the invention is in the production of printed circuit boards.

BACKGROUND OF THE INVENTION

In applications such as printed circuit board (PCB) production, a laser may be used to expose a pattern on a photoresist coating on a copper coated substrate. In a typical exposure system such as the DP 100 of LIS of Germany and available from Orbotech Ltd. of Yavne, Israel, a CW UV laser beam is scanned across the PCB surface, while its intensity is modulated in accordance with a raster pattern to be generated. The modulating device receives electronic pixel data supplied by control circuitry. In modern PCB production it is desirable to operate at high data rates to increase production speed. The practical data rate is limited by the modulation rate and/or the available laser power.

In the production of PCBs utilizing UV sensitive photoresists a CW Argon Ion laser is often used. Although they are widely utilized as UV light sources, Argon lasers, being gaseous lasers, have a number of drawbacks such as their being complicated and delicate to operate, poor maintainability and/or high price.

Various methods for producing UV laser radiation are known. For example, one such method utilizes an IR solid state laser oscillator to generate mode locked high repetition rate laser light pulses. The wavelength of the IR mode locked laser light is converted to UV by passing the mode locked IR light pulses through a non linear medium. However, the utilization of such lasers to expose photoresist at high data rates is severely limited by a paradox inherent in the frequency conversion process, which is extremely non-linear. Frequency conversion becomes more efficient as power increases.

Although mode locking is useful to obtain laser pulses each of which have a high peak power as is necessary to promote high efficiency frequency conversion, as the repetition rate of the laser pulses increases, for example in order to achieve increased data rates, peak power in individual pulses decreases and the resulting average UV power drops rapidly. Thus, for a given average IR power, the average peak power after frequency conversion drops as the repetition rate of the laser pulses increases, leading to reduced UV generation efficiency.

Practically, using pulsed lasers to write raster patterns is problematic for various reasons. Modulating data at a rate exactly equal to the pulse repetition rate of a mode locked laser is problematic due to difficulties in high speed pulse and data synchronization. Conversely, modulating data at a rate different than the pulse repetition rate of a mode locked laser is problematic due to timing errors in which a pulse is not available at exactly the time required to write or expose a pixel which is supposed to be written or exposed. This latter problem is particularly prevalent when data rates for writing pixels approach or exceed the pulse rate of an exposing radiation source—such as a mode locked laser.

In addition, in a system, such as the DP-100 system, in which feedback of light reflected from a scale is used to control the data flow, a "clean" signal, modulated only by the scale was considered to be necessary, whether the signal was used directly to control the data or when, as in the DP-100 system it provided the input to a locked (PLL) pulse generator.

SUMMARY OF THE INVENTION

One broad aspect of some embodiments of the invention deals with the use of modulation of a first light beam, such as a pulsed UV laser beam, to transfer information and in particular to expose a photosensitive surface. In some embodiments of the invention, the surface is exposed in a raster pattern and information modulation is asynchronous with the pulse repetition rate of the light pulses. In some embodiments of the invention, the first light beam is not pulsed.

In some embodiments of the invention, a second pulsed beam scans the surface together with the first light beam. The position of the second beam is determined and used to control the modulation of the first light beam.

In some embodiments of the invention the first and second beams are pulsed at a high repetition rate. Herein, a high pulse repetition rate light beam, such as is provided by a solid state laser diode pumped mode locked laser, is termed "quasi-CW". Asynchronously modulating pulsed radiation, such as by high pulse repetition rate mode locked laser radiation, is termed "quasi-CW modulation."

In embodiments of the present invention employing a quasi-CW modulating system, the pulse repetition rate may be less than one laser pulse per increment of the modulation data rate. In others it may be higher than the modulation data rate.

One broad aspect of the invention relates to systems and methods to determine the presence of a scanned pulsed laser beam at a plurality of locations along a scan path. A marked scale is provided and an optical clock is generated as the reflected from the scale. In some embodiments of the invention the instantaneous location of the pulsed beam is determined to a greater precision than the distance between markings. Additionally, data for modulating a second laser beam may be controlled in response to the reflection of the first beam.

Another broad aspect of the invention relates to systems and methods to determine the presence of a pulsed datamodulated scanned laser beam at a plurality of locations as it is scanned along a scan path, and then modulating data at least partly in response to determined positions of the beam. A determination of the presence of the beam is made at least at three locations in the scan path, however such determination may be made at any number of locations.

According to some embodiments of the invention, the system comprises a pulsed UV laser light source and a pulse rate multiplication device which multiplies the pulse repetition rate of the UV laser light. Such pulse rate multiplication device, is however not absolutely required. In one aspect, some embodiments of the present invention allow for data rates higher than the laser's pulse repetition rate prior to the multiplication. Additionally and alternatively, portions of the UV laser light are independently and spatially modulated at a data rate that is suitable to be quasi-CW modulated, and the data rate used to modulate each portion is lower than the overall data rate.

In some embodiments of the invention, a laser writing system, for example, for directly imaging PCBs, is provided.

This system optionally utilizes a high power solid state pulsed laser at a relatively long wavelength and low repetition rate, for example an IR mode locked laser oscillator operating at about 80 MHz and optionally having an average power of at least 1 W. The system transforms this laser light to UV, for example using a non linear optical medium. The medium may be located external to the laser cavity. The pulsed UV light is amplitude modulated and used to scan and expose a PCB coated with a UV sensitive resist to form a pattern.

In some embodiments of the invention, the UV light comprises a quasi-CW train of pulses as described above, such that methods known in the art may be used to modulate the UV light and utilize it to scan the area to be exposed.

There is thus provided, in accordance with an exemplary embodiment of the invention, apparatus for scanning a beam across a surface, comprising:

a scanner that scans a pulsed laser beam across a surface; and
  a position indicator receiving an input from said pulsed laser beam at a plurality of locations across said surface, and outputting position indications indicating a position of said pulsed laser beam along said surface.

In an embodiment of the invention the surface includes a plurality of spaced markings, such that a modulated pulsed laser beam is reflected from said surface.

In an embodiment of the invention, the position indicator includes a detector, wherein said detector receives said modulated pulsed laser beam and provides a modulated signal.

In an embodiment of the invention, the response time of said detector is slower than a pulse rate of said pulses, such that said detector outputs a signal that generally does not distinguish said pulses.

In an embodiment of the invention, the apparatus includes a data modulator modulating a data bearing laser beam in response to said position indications.

In an embodiment of the invention, the apparatus includes a clock generator generating a clock signal; and a controller that receives said position indications and controls the clock generator responsive to said position indications. In an embodiment of the invention, the apparatus includes a data modulator modulating a data bearing laser beam in response to said clock signal.

There is further provided, in accordance with an exemplary embodiment of the invention, apparatus for scanning a beam across a surface, comprising:

a first beam;
  a modulator that receives said first beam at an input portion thereof, and produces a modulated beam at an exit portion thereof, based on a modulation signal thereto;
  a second beam, said second beam being pulsed;
  a scanner that receives the modulated beam and the second beam and scans the modulated beam in a first beam path across the surface and the second beam along a second beam path substantially parallel to the first beam path;
  a sensor sensing the second beam and periodically indicating a sensed position of said second beam at ones of possible locations in said second beam path; and
  a controller that provides said modulation signal to said modulator at least partially in response to the sensed position of said second beam in said second beam path.

In an embodiment of the invention, the modulation signal is controlled at a data rate and the first and second beams are pulsed at a rate substantially higher than the data rate. Alternatively, the modulation signal is controlled at a data rate and wherein the first and second beams are pulsed at a rate lower than the data rate. Alternatively, the modulation signal is controlled at a data rate and wherein the first and second beams are pulsed at a rate substantially the same as the data rate.

Optionally, the first and second beams have substantially the same wavelengths.

Optionally, the first beam includes energy at a wavelength different from the wavelength of the second beam.

In an embodiment of the invention, the apparatus includes a marked scale upon which the second pulsed beam impinges, such that the second beam is reflected therefrom to form a modulated reflected pulsed beam. Optionally, the second beam impinges on the scale at an angle to its surface, such that the modulated reflected pulsed beam is reflected along an axis different from the axis along which the second pulsed beam impinges on the scale. Optionally, the sensor includes a detector that receives said modulated reflected pulsed beam and generates a modulated signal therefrom, said controller providing said modulation, based on a timing coordinated with said modulated signal.

In an embodiment of the invention, the controller includes: a clock generator that receives the modulated signal and generates a timing clock having a clock frequency that is controllably related to the frequency of the modulated signal. Optionally, the clock generator includes: a first generator that generates an intermediate clock and an inverse intermediate clock having the same frequency and inverse phases; and switching circuitry having two inputs that receive the intermediate clock and the inverse intermediate clock respectively and a timing clock output to which the clock at one of the two inputs is selectively switched, such that the average frequency of the timing clock at the output is controlled by said selective switching. Optionally, the switching circuitry switches said inputs to said output responsive to clock correction information.

In an embodiment of the invention, the apparatus includes: a data store containing stored modulation information, which passes said information to said modulator for modulating the first beam, based on timing of said stable clock.

In an embodiment of the invention, the modulated light beam scans over the surface in a first direction and wherein the surface moves in a direction perpendicular to the direction of scanning such that the surface is illuminated by a raster scan.

Optionally, the surface comprises a photosensitive photoresist.

Optionally, the first beam and the second beam each comprise a laser beam.

Optionally, the modulation of the modulated light beam is asynchronous with the pulses of the second pulsed beam.

There is further provided, in accordance with an exemplary embodiment of the invention, a system for recording a pattern on a substrate, comprising:

a pulsed laser outputting a pulsed laser beam;
  a modulator that receives the pulsed laser beam and produces a modulated pulsed beam in response to a pixel defining signal;
  a scanner that receives the modulated pulsed beam and scans it across the surface of the substrate to record a pattern defined by pixels on said surface,
  wherein a rise time of the pixel defining signal is less than a pixel period of the pixels.

There is further provided, in accordance with an embodiment of the invention, a method for manufacturing electrical circuits, comprising:

scanning a pulsed laser beam across a marked surface to provide a position modulated pulsed laser beam;

sensing said position modulated pulsed laser beam and at least partly in response to said sensing outputting position indications indicating a position of said pulsed laser beam on said marked surface;

scanning a data modulated laser beam across a photosensitized surface formed on an electrical circuit substrate; and modulating said data modulated laser beam in response to said position indications to expose said photosensitizes surface according to a predetermined electrical circuit pattern.

There is further provided, in accordance with an embodiment of the invention apparatus for manufacturing electrical circuits, comprising:

a scanner scanning a pulsed laser beam across a marked surface to provide a position modulated pulsed laser beam and scanning a data modulated laser beam across a photosensitized surface formed on an electrical circuit substrate;

a beam position determinator operative to sense said position modulated pulsed laser beam and to output a position indication signal indicating a position of said pulsed laser beam on said marked surface; and a modulator modulating said data modulated laser beam at least partly in response to said position indication signal to record a predetermined pattern on said photosensitized surface.

BRIEF DESCRIPTION OF FIGURES

Exemplary embodiments of the invention are described in the following description, read in with reference to the figures attached hereto. In the figures, identical and similar structures, elements or parts thereof that appear in more than one figure are generally labeled with the same or similar references in the figures in which they appear. Dimensions of components and features shown in the figures are chosen primarily for convenience and clarity of presentation and are not necessarily to scale. The attached figures are:

FIGS. 8A–8G are simplified pictorial illustrations of an acoustic wave at consecutive stages of generation in an acousto-optical modulator crystal and provision of laser pulses at a first pulse rate;

FIGS. 9A–9G are simplified pictorial illustrations showing various stages, corresponding to stages shown in FIGS. 8A–8G, of exposure of a run of pixels on a substrate to be exposed at a first pulse rate;

FIGS. 10A–10G are energy graphs showing accumulated laser energy along a run of pixels at each of the stages of exposure shown in FIGS. 9A–9G;

FIGS. 11A–11G are simplified pictorial illustrations of an acoustic wave at consecutive stages of generation in an acousto-optical modulator crystal and provision of laser pulses at a second pulse rate;

FIGS. 12A–12G are simplified pictorial illustrations showing various stages, corresponding to stages shown in FIGS. 11A–11G of exposure of a run of pixels on a substrate to be exposed at the second pulse rate;

FIGS. 13A–13G are energy graphs showing accumulated laser energy along a run of pixels at each of the stages of exposure shown in FIGS. 12A–12G;

FIGS. 14A–14G are simplified pictorial illustrations of an acoustic wave at consecutive stages of generation in an acousto-optical modulator crystal and provision of laser pulses at a second pulse rate different from that shown in FIGS. 11A–11G;

FIGS. 15A–15G are simplified pictorial illustrations showing various stages, corresponding to stages shown in FIGS. 14A–14G of exposure of a run of pixels on a substrate to be exposed at the second pulse rate;

FIGS. 16A–16G are energy graphs showing accumulated laser energy along a run of pixels at each of the stages of exposure shown in FIGS. 15A–15G;

DETAILED DESCRIPTION OF EXEMPLARY EMBODIMENTS

Figure 1:
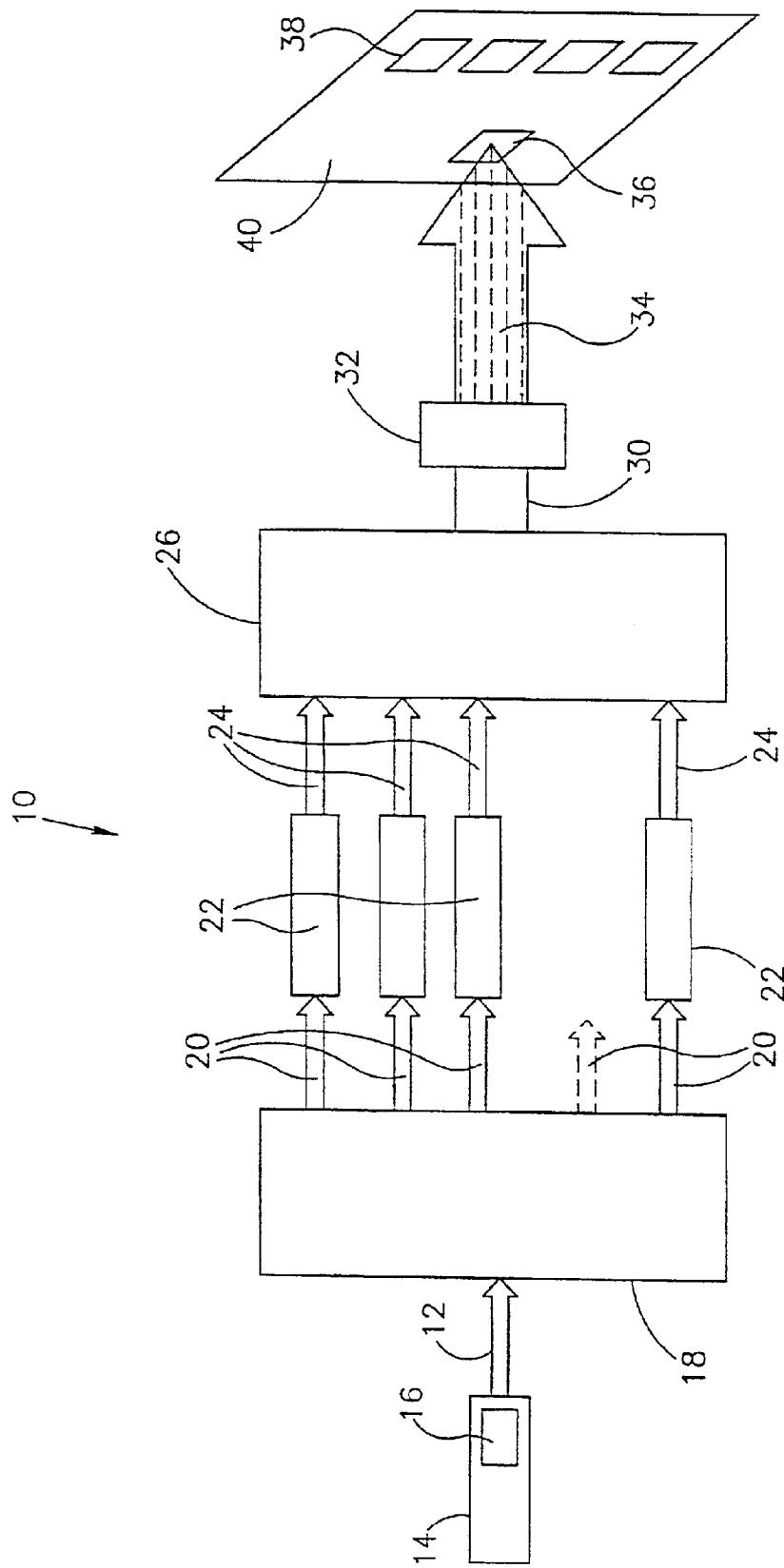
FIG. 1 is a schematic diagram showing the basic operational principle of certain embodiments of the present invention.

Embodiments of the inventions described hereinbelow relate to systems and methods for exposing patterns on a photosensitive surface of a substrate using a pulsed laser. Such photosensitive surfaces are found on in fabrication printed circuit board substrates, and the patterns are portions of electrical circuits which are to be formed on the substrate. An example, one commercially available system for exposing patterns on photosensitive surfaces of substrates using continuous wave laser light is the DP-100 direct imaging system available from Orbotech Ltd. of Yavne Israel. Systems for directly exposing images on photosensitive substrates, without the use of masks, are generally referred to as direct imaging systems.

Recent advances in laser technology are making the use of pulsed solid state lasers in direct imaging systems commercially feasible. The following written description of exemplary embodiments of direct imaging systems includes a general background of discussion of technologies employed in pulsed laser direct imaging systems as well as techniques and subsystems employed to determine the location of a pulsed laser beam as it scanned in a direct imaging system. The general background discussion should not be interpreted in any way as limiting the scope of the inventions described and claimed hereinbelow, but rather it should be only considered as a presentation of examples of suitable methodologies, among any number of other possible other suitable methodologies, to carry out the inventions described and claimed hereinbelow.

A way of overcoming the disadvantages of using an Argon Ion laser for exposing UV sensitive photoresists on PCBs, as described in the background section, is to start with an IR or other relatively long wavelength laser, for example, a solid state laser providing a mode locked IR output, and then to double or otherwise to convert its optical frequency (or wavelength) until UV radiation is obtained. This increase in optical frequency is achieved by doubling the optical frequency of the light at least once.

Solid state IR lasers are relatively efficient and reliable, a situation that facilitates the obtaining of mode-locked UV laser radiation at sufficiently high power through pumping and optical frequency conversion.

Because optical frequency conversion is a nonlinear process whose efficiency increases with increasing initial laser power, UV laser radiation is obtained by harmonic generation, for example using a non-linear crystal placed in the path of a laser beam produced by a high power IR or red laser. A commercially available frequency converted laser outputting UV laser light is the VANGUARD™ laser from Spectra Physics lasers. An alternative to produce pulsed UV laser light is with a Tsunami mode-locked Ti:saphire laser from Spectra-Physics Lasers, pumped by a laser such as the Millenia laser of Spectra-Physics. While the pulse repetition rate of the VANGUARD™ laser is in the order of 80 MHz and may, at best, be in the same range as data rates useful in high speed writing for PCB production, the above referenced problems of pulse/data synchronization make its use problematic. Moreover, the native repetition rate of pulses generated by mode locked lasers sets a limit on possible data rates using conventional methods of information modulation whereby information is modulated synchronously with the pulse repetition rate.

Thus, in accordance with some embodiments of the invention, the pulse repetition rate is further increased from the native pulse repetition rate generated by the mode locked laser by using systems built in accordance with embodiments of the present invention. Optionally, the pulse rate multiplication systems operate externally to the laser housing, after wavelength of the laser beam has been converted. Thus in accordance with some embodiments, wavelength conversion is performed while laser pulses are still at a relative low pulse repetition rate and high peak power per individual pulse as compared to the pulse rate and peak power after pulse rate multiplication is performed. In accordance with exemplary embodiments of the invention, the pulse repetition rate thus achieved after pulse rate multiplication is high enough to allow for quasi-CW modulation of the thus generated pulsed laser beam relative to a high data rate stream of information.

Thus, for example, in applications employing a pulse rate multiplier, multiplication of the pulse repetition rate is achieved by a device external to, and optionally downstream of, the high power UV laser which does not interfere with the laser's operational conditions so as to enable the laser to generate UV laser light at relatively high efficiency.

In accordance with some other embodiments of the present invention, a single input laser beam is provided and spatial portions of the beam are each simultaneously and independently information modulated by a data channel in an array of data channels. Each channel has a reduced data rate suitable to quasi-CW modulation of a spatial portion of the input laser beam, while an overall data increased rate for the entire beam is obtained.

Reference is now made to FIG. 1 which schematically depicts the basic operational principles of an exemplary UV laser exposure system 10, employing a pulsed laser source and a pulse repetition rate multiplier, used in direct writing on a photoresist and built in accordance with some embodiments of the present invention. A pulsed UV laser beam 12, obtained from a high power pulsed laser 14, which may or may not be passed through a wavelength converter 16, such as a non-linear crystal inside or external to the laser cavity, and having a pulse repetition rate $f_0$, enters a beam splitting device 18, which splits the initial pulsed beam into N beams 20. The N split beams are then each delayed by delay optical circuits 22, to produce N time delayed pulsed beams 24 which are subsequently combined by beam combiner 26 to form a combined beam 30.

Figures 6, 7:
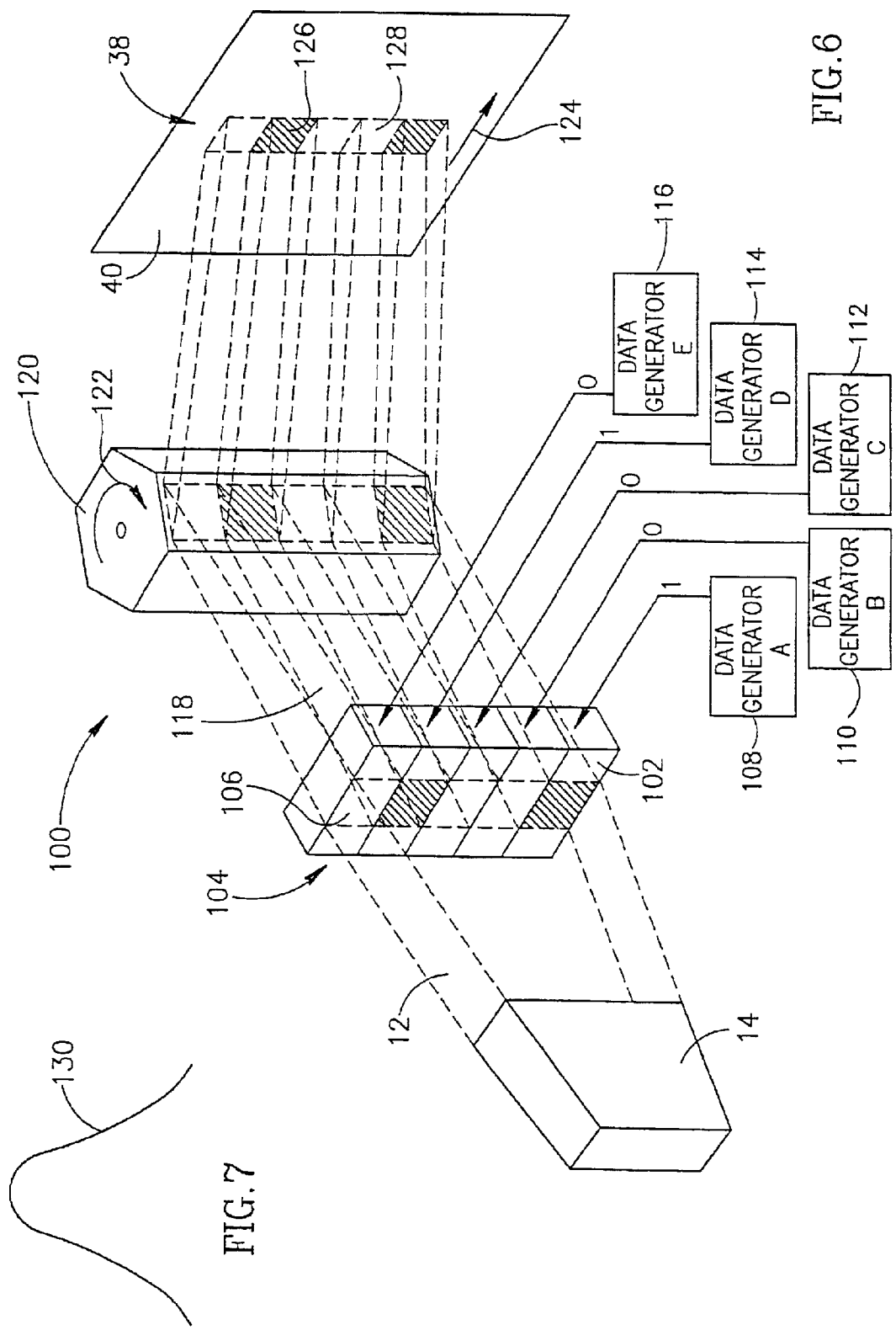
FIG. 6 is a schematic diagram of a system for writing a raster pattern on the surface of a substrate by simultaneously independently data modulating separate portions of an input laser beam.
FIG. 7 is a graph of the energy profile of a laser beam pulse along an axis of scanning.
Figure 16D:
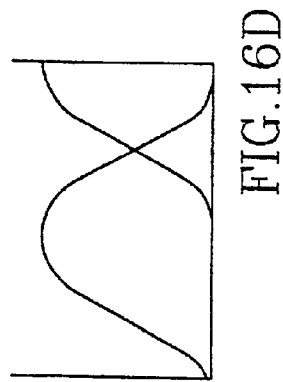
Figure 16E:
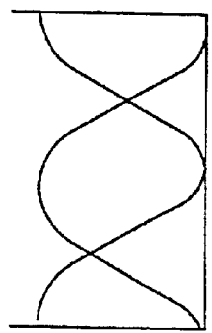
Figure 15D:
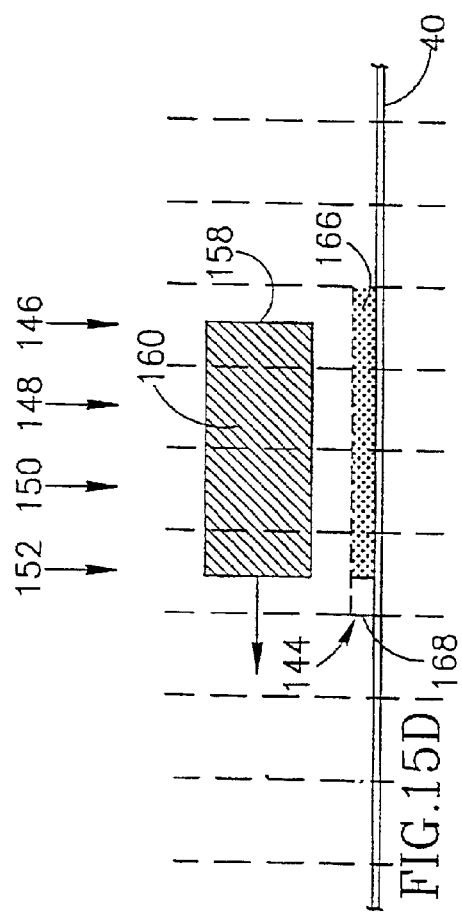
Figure 15E:
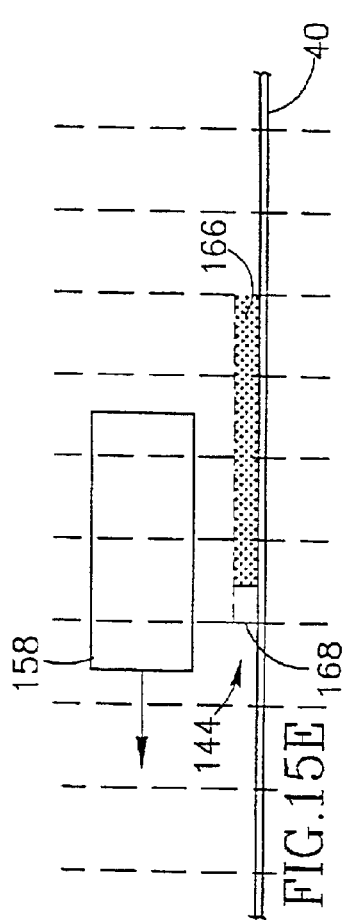

Combined beam 30 is passed through a modulator 32, operative to data modulate the beam 30, or portions 34 of the beam. One possible modulator is described hereinbelow in greater detail with respect to FIG. 6. Combined beam 30 is further directed to a single target 36, or a plurality of targets 38 to expose a pattern on photoresist on a substrate 40, such as a PCB. It is appreciated that alternatively each of N time delayed beams 24 may be information modulated by a plurality of modulators (e.g. as shown in FIG. 6) and mutually directed to expose targets 36 and 38 on substrate 40 without recombination of each of the N time delayed beams 24.

When a time delay $T_n$, equal to $n\Delta t$ is imposed on each of N beams 20 (where n is a numbering index of the beams, from 0 to N-1) by their respective delay optical circuits 22, a series of time delayed pulsed beams 24, the pulses of which are shifted in time by $\Delta t$, is obtained. The time delayed pulsed beams 24 are also separated in space when the optical set up shown in FIG. 1 is used. The pulse repetition rate of a beam in a series of time delayed pulsed beams 24 is the same as the pulse repetition rate of beam 12, however the temporal offset of pulses among time delayed pulsed beams is a function of delay $T_n$ and the number of delay lines N.

The only general condition that these delayed beams have to satisfy is:

$$N*\Delta t \leq 1/f_0 \qquad \text{Eq. (1)}$$

where N is the number of beams 20 and $f_0$ is pulse repetition rate of laser 14. At the end of an Nth pulse (a delay of (N−1)*Δt) in a time delayed pulsed beam 24, a subsequent pulse in beam 12 enters beam splitting device 18 and the splitting and delaying process repeats itself. In case NΔt= 1/$f_0$, the Nth pulse of a pulse in time delayed pulsed beams 24 will occur Δt prior to the first pulse associated with a subsequent pulse in beam 12. Delay $T_n$, may be varied or kept constant over the period $t_0$=1/$f_0$, as long as the condition of equation (1) is satisfied. In general, it is not necessary that the time between the Nth pulse of one series of pulses and the first pulse of the next series of pulses be exactly equal to Δt. Furthermore, it is not necessary that the time between pulses be exactly the same, nor is it necessary that the pulses have precisely the same energy at least for writing on PCBs. Time delayed pulsed beams 24 enter the beam combining device 26, wherein the individual time delayed pulsed beams 24 are combined according to a predetermined scheme.

Ideally, all the N pulses should be of substantially the same energy and equally spaced. This situation is generally preferable, although not required, since this results in a minimum fluctuation of laser power. In some embodiments of the present invention, variations in energy are compensated by scanning beam 30 to expose a pattern including a plurality of targets 38, wherein separate portions 34 of combined beam 30 each expose a line of targets. Each target in the plurality of targets 38 is exposed at least twice by partially overlapping combined beam 30 in successive scans in accordance with methods shown and described in WO 00/02424, the disclosure of which is incorporated herein by reference.

The following section describes the details of steps of a) splitting an input beam 12 to produce N beams 20; b) delaying pulses in at least some of N beams 20 to produce time delayed pulsed beams 24; c) recombining the time delayed pulsed beams 24, and d) redirecting the combined beam 30, all in accordance with an embodiment of the present invention.

Figure 2:
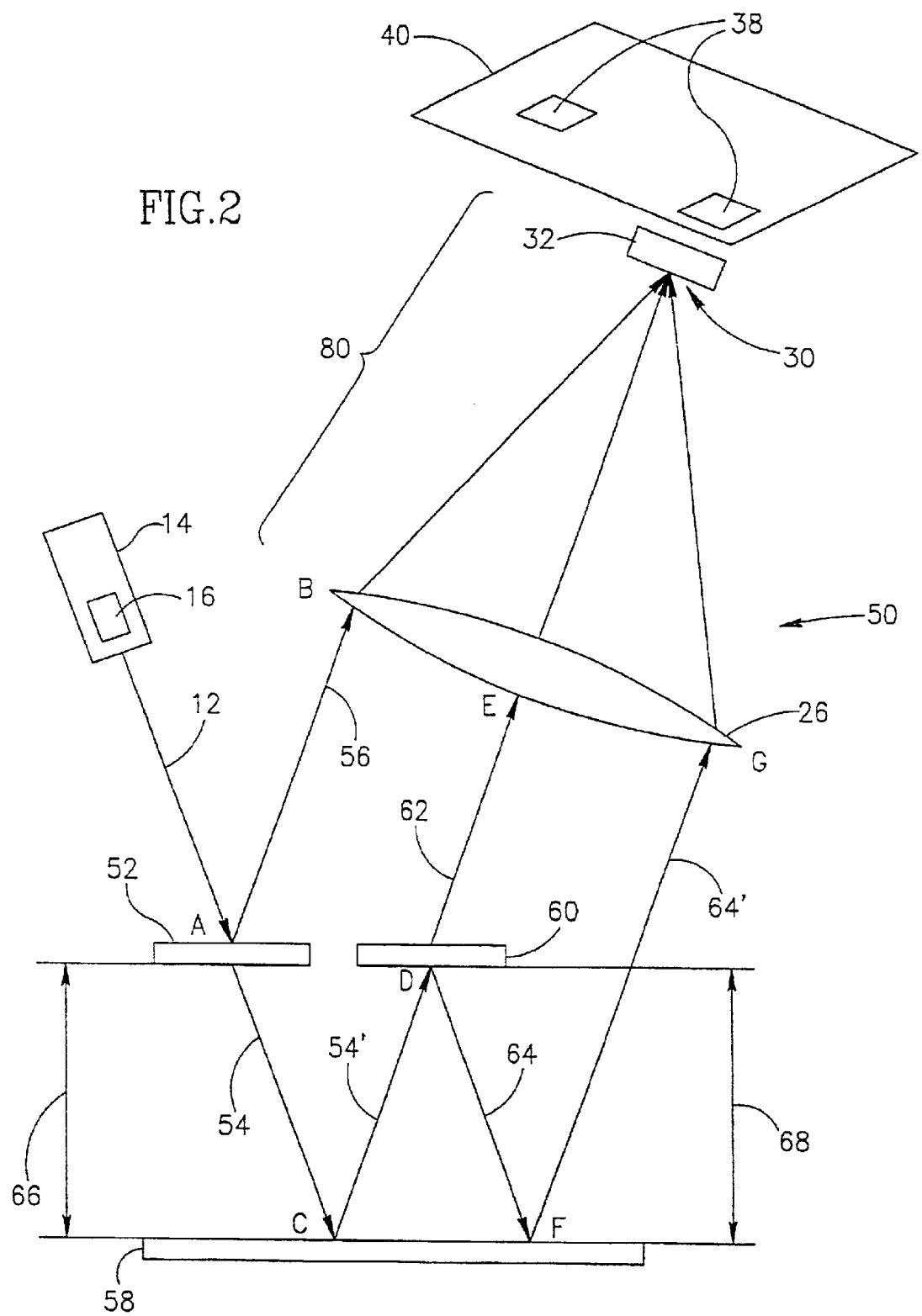
FIG. 2 is a schematic diagram showing a pulse repetition rate multiplication device in accordance with an embodiment of the present invention.

Reference is now made to FIG. 2, which shows a pulse repetition rate multiplication device 50 constructed and operative in accordance with an embodiment of the present invention. Repetition rate multiplication device 50 may include a beam splitting device 18, delay optical circuitry 22 and a beam combiner 26 shown in FIG. 1, and is employed externally to a laser 14, whose optical frequency is converted by a wavelength converter 16, for example by harmonic generation, as is known in the art.

A pulsed, optionally collimated, UV laser beam 12, is made to impinge on a first partially reflective front surface mirror 52. The initial pulsed beam 12 is split into two beams, one of which is transmitted (54) and the other of which is reflected (56). Transmitted beam 54 is reflected by a 100% reflective mirror 58. The resulting post reflection transmitted beam (54') is directed towards a second partially reflective front surface mirror 60. Post reflection transmitted beam 54' is split by mirror 60 into a second transmitted beam (62) and a second reflected beam (64) directed to mirror 58. Reflected beam 64 is reflected again by mirror 58 to form beam 64'. Beams 54 and 64 may be made to impinge on a single mirror 58 as shown in FIG. 2 or, alternatively, on two separate mirrors (not shown in FIG. 2 for the sake of clarity).

In order to obtain from an initial pulsed laser beam 12 three beams 56, 62 and 64', together forming time delayed pulsed beams 24 in FIG. 1, generally having pulses of equal peak power, in the arrangement shown in FIG. 2 the reflectivity and transmission of partially reflective mirrors 52 and 60 should ideally be as follows: partially reflective mirror 52—reflectivity 33.33% and transmission 66.67%; partially reflective mirror 60—both reflectivity and transmission 50%. In this way beams 56, 62 and 64' will all have power $P_f$=$P_i$/3 where $P_f$ is the final power of each beam and $P_i$ is the initial power of beam 12. The power in each of split beams 56, 62 and 64' is thus controlled by the reflectivity of partially reflective mirrors 52 and 60. This division is based on lossless mirrors. If there is some loss on the mirrors, the reflectivities are ideally adjusted accordingly.

The embodiment shown in FIG. 2 may be extended to produce any desirable number N of time delayed pulsed beams of equal power by employing a series of lossless partially reflecting mirrors such as 52 and 60 having reflectivity values given by 1/N, 1/(N−1), . . . , ½, respectively.

In the embodiment shown in FIG. 2, lengths AB, ACDE and ACDFG control the time delays between beams 56, 62 and 64'. The lengths AB, ACDE and ACDFG are controlled by distances 66 and/or 68, and the angle between mirrors 52 and 58 on one hand and 58 and 60 on the other. In order to obtain three substantially equally spaced (in time) pulses out of each initial pulse in beam 12, the lengths should be substantially ACDFG−ACDE=ACDE−AB=($t_0$/3)*c, where c is the speed of light in the appropriate medium. It is appreciated by persons skilled in the art that the distance will have to be modified in accordance with the thickness and refractive indices of mirrors 52 and 60.

Beams 56, 62 and 64', corresponding to time delayed pulsed beams 24 in FIG. 1, are, for example, combined by beam combining device 26 (a lens as shown is an exemplary embodiment) into a combined beam 30 impinging on modulator 32 which is operative to modulate information into beam 30. At the end of a cycle of "splitting-combining-redirecting" applied to a pulsed beam 12, a subsequent pulse in beam 12 reaches point A on mirror 52 and the whole beam "splitting-combining-redirecting" cycle repeats itself. Dividing each pulse in beam 12 into three pulses means that the initial pulse repetition rate of laser 14 is tripled by the action of pulse rate multiplication device 50.

In some embodiments of the present invention, mirrors 52, 58 and 60 and beam combining device 26, are integrated into a single optomechanical structure in order to obtain a stand alone pulse repetition rate multiplying apparatus. Such a stand alone unit has the possibility of being retrofitted to a pulsed laser 14 and to serve different lasers at different times. By operating externally to laser 14, pulse rate multiplication device 50 does not perturb the proper operation of the laser or its efficiency. Pulse repetition rate multiplier device 50, when used with mode-locked lasers, allows for the multiplication of the laser's original pulse repetition rate without changing its resonant cavity length or any other characteristics.

Figure 3:
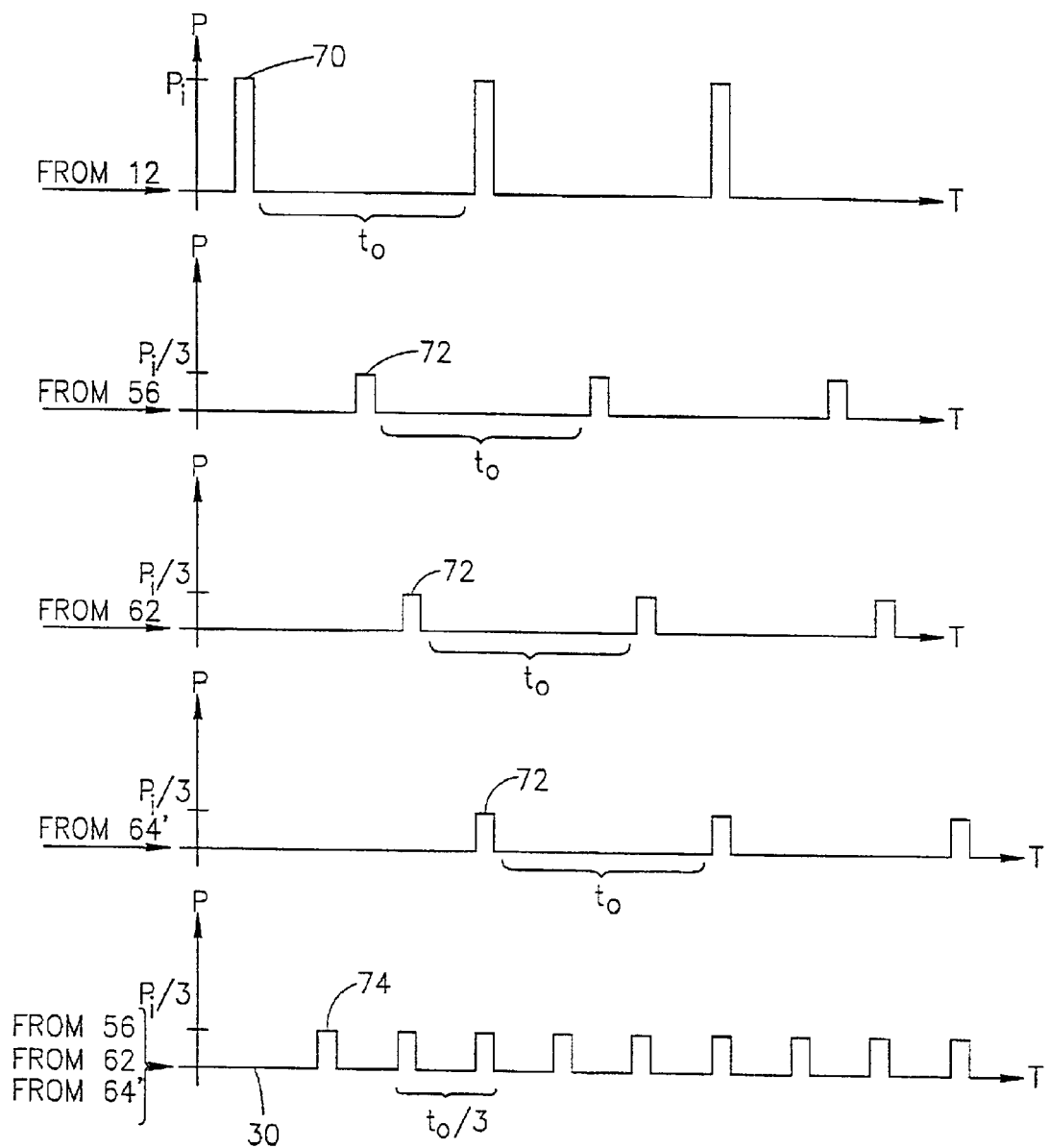
FIG. 3 is a timing graph of input, intermediate and output beam pulses entering and exiting the pulse repetition rate multiplication device sketched in FIG. 2.

Reference is now made to FIG. 3 which is a timing graph showing the timing and peak power of pulses in beam 12 input into pulse repetition rate multiplication device 50, the timing and peak power of pulses in beams 56, 62 and 64', and the timing and peak power of pulses in combined beam 30 impinging on modulator 32 in accordance with the embodiment shown in FIG. 2. As seen in FIG. 3 beam 12 has pulses 70 each of which has a peak power $P_i$ and is offset in time by $t_0$. Each of beams 56, 62 and 64' has pulses 72 each of which has a peak power $P_i$/3 and is offset in time from other pulses 72 in the same beam by time $t_0$. Each pulse 72 in one of beams 56, 62 and 64' resulting from a pulse 70 in beam 12 is offset in time respective to a corresponding pulse 72 resulting from a pulse 70 in the other two of beams 56, 62 and 64' by time $t_0$/3 or 2$t_0$/3 respectively. Upon combining beams 56, 62 and 64', combined beam 30 has pulses 74 each of which has a peak power $P_i/3$ and is mutually separated in time by time interval $t_0/3$. Thus, combined beam 30 has three times the pulse repetition rate and duty cycle of pulses in beam 12. Although the peak power of each pulse 74 is ⅓ the peak power of each pulse 70, the same average power is maintained.

Figure 4:
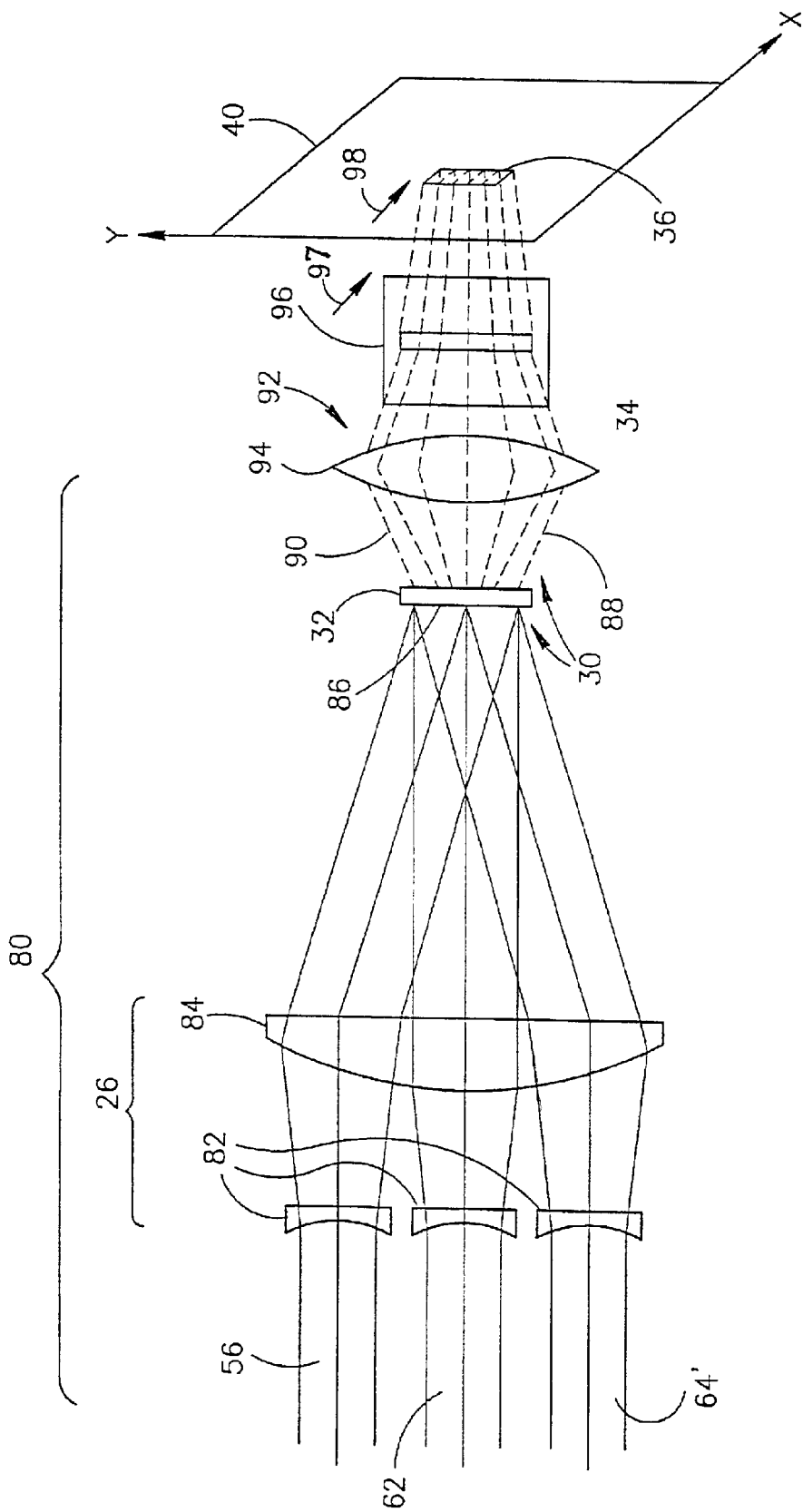
FIG. 4 is a schematic diagram of an exemplary beam recombination setup in accordance with an embodiment of the present invention.

Reference is now made to FIG. 4 which shows details of beam combining and modulating region 80 of FIG. 2, in accordance with an embodiment of the invention. Each individual beam 56, 62 and 64' is imaged onto an active aperture portion (not shown) of a modulator 32, conjointly by a combination of spherical lenses 82 (negative lenses are shown, positive lenses may also be used) and cylindrical lens 84, to form combined beam 30 on the input surface 86 of modulator 32. It is appreciated by persons skilled in the art that the combined beam 30 may need to be further optically shaped to match the active aperture portion and other characteristics of modulator 32. For instance, an optional cylindrical lens (not shown), its optical axis oriented at 90° with respect to lens 84, may be interposed into the beam path to shape the beam 30 into to a desired slit-like shape at modulator 32. According to this imaging scheme, each individual beam 56, 62 and 64', together forming combined beam 30, optionally completely illuminates the active aperture portion of modulator 32, and modulator 32 modulates the combined beam 30 at a data rate in accordance with a pattern to be generated. After being modulated by modulator 32, the part of combined beam 30 inside of boundaries 88 and 90 are imaged by imaging optics 92, a single lens 94 being shown for simplicity of illustration, via a multi-faceted rotating polygon mirror 96 (only one face and its direction of motion 97 are shown), onto a target 36 on substrate 40. Polygon mirror 96 rotates to scan a line of targets 36 in the direction of scanning 98, for example along the X axis, while substrate 40, such as a photoresist clad PCB, moves in the generally orthogonal direction corresponding to the Y axis.

In accordance with some embodiments of the present invention, portions 34 of combined beam 30 are simultaneously independently modulated by modulator 32 to write multiple targets 38 (FIG. 1), each of which are mutually spatially offset.

Figure 5:
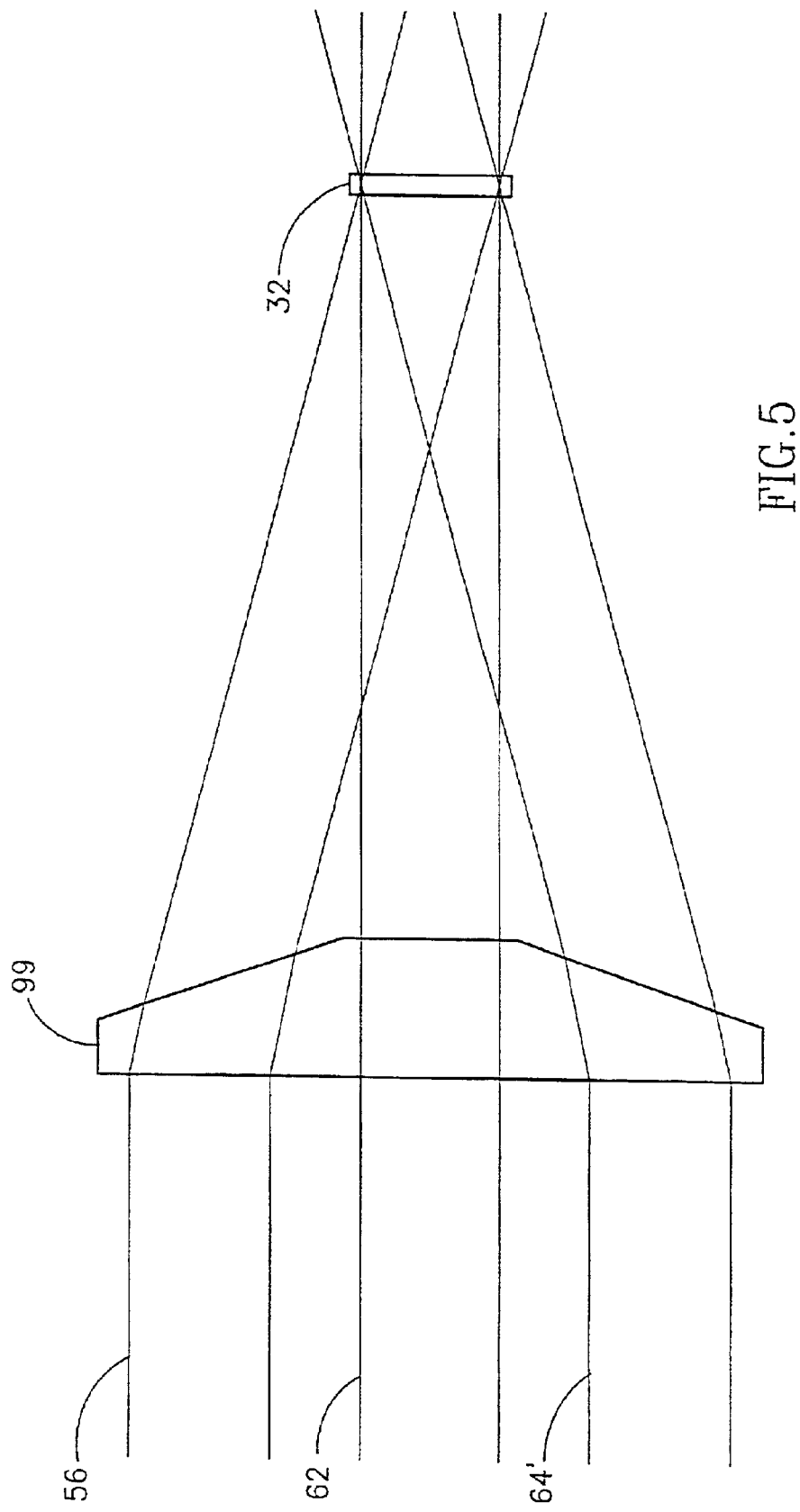
FIG. 5 is is a schematic diagram of an alternative beam recombining component in accordance with an embodiment of the present invention.

It is appreciated by persons skilled in the art that the relative distances between modulator 32, lens 94 and polygon 96 in FIG. 4 are only schematic representations. In some embodiments according to this invention, lenses 82 and 84 are replaced by prism 99, shown in FIG. 5, which combines beams 56, 62 and 64' on modulator 32. Other methods of scanning a beam, as known in the art may also be used.

If, instead of lens 26 in FIG. 2, three individual lenses are positioned in split beams 56, 62 and 64', the beams could be aimed towards three different targets 38 simultaneously. Furthermore, each beam can be spread to form a line and modulation schemes, such as those known in the art, may be provided to modulate individual pixels in the lines formed by each of beams 56, 62 and 64'.

By varying distances 66 and 68 in FIG. 2, variable/different time delays may be imposed on beams 62 and 64'. By varying angle between mirrors 52 and 60 on the one hand and mirror 58 on the other hand, (see FIG. 2), the directions of beams 56, 62 and 64' may be controlled. Additionally, the diameter of input beam 12, may be optimized to fit the optics geometry. It should be understood that the angles shown are greatly exaggerated. In general the angle between the beams impinging on modulator 32 is very small.

Reference is now made to FIG. 6 which is a simplified pictorial illustration of a laser writing system 100 for writing a raster pattern on the surface of a substrate by simultaneously independently data modulating separate portions of an input laser beam 12, in accordance with some embodiments of the invention.

In accordance with some embodiments of the present invention a pulsed laser beam 12 is emitted by a laser 14, for example, a mode locked laser operative to generate a stream of laser pulses. Beam 12 is shaped by suitable optics (not shown) and is imaged onto the input surface 102 of an acousto-optic multi-channel modulator 104. Multi-channel modulator 104 optionally includes a plurality of laser beam modulating channels 106, formed, for example of a suitable material such as crystalline quartz, that transmits radiation of the laser wavelength. Each of channels 106 is independently controlled by one of data generators 108–116 to modulate data at a data rate.

Laser beam 12 passes through the modulator medium associated with each of channels 106, each of which independently modulates a spatially defined portion 118 of laser beam 12. An image of a central plane of each of channels 106 is projected by suitable optics (not shown) via a rotating polygon 120 and subsequently onto a substrate 40 at a plurality of targets 38 forming pixels in a raster pattern. As polygon 120 rotates, in the direction of arrow 122 images of the central planes of channels 106 are continuously scanned across substrate 40 in scan direction 124 while data is modulated at a data rate. Thus when an acoustic wave is present in a channel 106 the respective laser beam portion 118 is deflected so that the portion exposes one of targets 38 such as pixel 126 on substrate 40. When no acoustic wave is present in a channel 106, the respective portion 118 does not expose a target, for example pixel 128. The data rate is the rate at which the modulator is switched on and off, to generate or to stop generating, an acoustic wave, it being appreciated that the acoustic wave has a generally non-instantaneous rise time and travel time through the medium forming a channel 106 in modulator 104.

It is noted however that rise times of a signal provided by one of the generators 108–116 is shorter than the time taken by deflected laser portions to expose successive in target 38. Typically, the rise time of each of the channels 106 of modulator 104 is less than a pixel period.

In some embodiments of the invention, modulator 32 may be, for example, a modulator employing operative principles described in U.S. Pat. No. 5,309,178 to Abraham Gross, and further described WO 00/02424, both of which are incorporated herein by reference. An exemplary arrangement of optics for projecting a laser beam onto a multi-channel acousto-optic modulator and scanning the laser beam to generate a pattern on a PCB is also described in WO 00/02424.

Generally, portions 118 are at least partially mutually overlapping, and the total number of channels 106 generally corresponds to the number of pixel lines in a pattern to be simultaneously written on substrate 40. In accordance with some embodiments of the present invention, the size of the image of each channel when projected on substrate 40, in the direction of scanning 124, is for example, equivalent to three pixels.

It is noted that by modulating laser beams 12 with a multichannel modulator operative to simultaneously modulate various spatially defined portions 118, inasmuch as the data is divided over a spatial region a desired overall data rate may be obtained while simultaneously reducing the data rate provided to each channel 106. Thus, if modulator 32 has a total of N data modulation channels, and S is the total data rate required to write a raster pattern in a given time, each portion 118 of laser beam 12 is temporally modulated at a data rate which is S/N.

In some exemplary embodiments of the present invention modulator 32 includes at least 24 adjacent channels 106. Assuming that data is to be written at a data rate of between 300–1200 Mega pixels/second, then the modulation data written by each channel ranges between 12.5–50 Mega pixels/second. Assuming that laser 12 generates a stream of approximately 80 MHz pulses, then each pixel is written by an average of between 1.6–6.4 laser pulses as a function of the data rate in each channel.

Thus, the average number of pulses available to expose a pixel, may be increased by increasing the repetition rate of pulses, for example by interposing a pulse repetition rate multiplier such as device 50 (FIG. 2) between laser 14 and modulator 32. Alternatively, the effective data rate per channel may be reduced. Reduction of the data rate per channel may be achieved either by reducing the overall data rate S or by increasing the number of channels 106.

It is appreciated by persons skilled in the art that individually modulated portions of laser beam 12 may be spatially overlapping portions or discrete portions, each of which is independently modulated by a channel in modulator 32, or by a separate modulator.

As the number of pulses in laser 12 available to write a pixel in a data stream approaches or falls below one pulse per pixel, a pattern written by a quasi CW writing mode using conventional modulating methods becomes more susceptible to timing errors. Timing errors occur when a data bit representing a pixel to be written, for example as provided by one of data generators 108–116, is missed, in whole or in part, by a pulse in laser beam 12. When timing errors occur, a pixel in a target 36 that should be written is in actuality only partly written or not written at all.

It is appreciated by persons skilled in the art that in systems for writing a raster pattern, timing errors particularly manifest themselves along edges extending between regions which are to be exposed and regions which are not to be exposed. Unaccounted for timing errors typically result in an unevenness or drift in the location of an edge. In accordance with some embodiments of the invention, a pulsed laser beam writing system, such as system 100, for exposing a raster pattern on a substrate is configured so that, during successive pulses, the location of an edge of a portion of the laser beam exposing a run of pixels is substantially fixed to a desired location to be exposed on substrate 40. Edge fixing is accomplished for example, by coordinating the velocity of the acoustic wave in the modulator 32 and the velocity of scanning. Preferably the velocity of an image of the acoustic wave formed by imaging optics 94 on substrate 40 and the velocity of scanning an image of the modulating portion of modulator 32 are substantially equal in magnitude (preferably <±25%) but directed in mutually opposite directions. Accordingly, coordinating the relative directions and velocities of the projected image of the acoustic wave and the velocity of scanning effectively "freezes" the image of the acoustic wave in modulator 32 on the substrate 40 as shown and described in greater detail hereinbelow with reference to FIGS. 8A–16G.

As a result of edge fixing, the location of the image of the acoustic wave becomes substantially "motionless" on the substrate and the location of edges in a region exposed by successive pulses becomes insensitive to the exact timing of light flashes resulting from the laser pulses. Inasmuch as the spatial extent of a spot formed by laser light portions 118 is greater than a single pixel wide in the scanning direction, for example, being about 3 pixels wide in the scanning direction, an adequate number of exposure pulses is provided at every point addressed by the beam as it sweeps across substrate 40. Although the size of the spot is greater than a single pixel wide in the scanning direction, the positioning of feature edges is still optimally determined by the size of the addressing elements which is a function of data rate at which pixels are addressed in each modulator channel 106 and the velocity of scanning. Further decreasing the ratio of laser pulses to pixel rate is ultimately limited by pattern errors arising from unevenness of exposure due to the Gaussian energy profile of the laser beam in the scanning direction.

It is noted that the foregoing effect is similar to the well known Scophony scanning effect, conventionally used to minimize spatial blurring of a generated pattern caused by: a) the finite velocity of the acoustic wave in the modulator and b) the continuous nature of the laser illuminator. In accordance with some embodiments of the present invention the finite velocity of the acoustic wave in a modulator channel 106 enables an acoustic signal corresponding to a data pixel to be impinged upon by multiple light flashes formed by successive pulses. Multiple mutually partially overlapping images of laser pulses, spatially limited by an edge of the acoustic wave which is fixed in relation to an edge to be written on substrate 40, are thus projected onto substrate 40. It should be noted that while the Scophony effect has been applied in the past to CW illumination, the application to pulsed scanning is believed to be new. Such application is based on the realization that it is not necessary to have CW illumination to write a well defined edge, but that pulsed illumination and especially quasi-CW pulsed illumination can also form a sharp edge, in conjunction with the effect.

Reference is now made to FIG. 7, which is a graph of the energy profile of a laser beam pulse along an axis of scanning. In accordance with some embodiments of the present invention, the energy profile 130 of laser beam 12 in the direction of scanning 124 (FIG. 6) is a generally Gaussian profile. Relative to the time scale of propagation of an acoustic wave in an acousto-optic modulator channel 106, and to the time to scan a pixel on substrate 40, mode locked laser pulses are essentially instantaneous. Each pulse is separated by a time interval ranging between 3–50 nanoseconds, depending on the repetition rate of pulses in laser beam 12, and whether the repetition rate is multiplied using a pulse repetition rate multiplier as described hereinabove. The quantity of energy delivered to a target 38 in a pulse is a function of the segment of laser energy profile 130 that reaches target 38. The segment of the laser energy profile in a laser pulse is determined by modulation provided by modulator 104, for example by the presence and position of an acoustic wave in an acousto-optical modulator.

Reference is now made to FIGS. 8A–8G which are simplified pictorial illustrations of an acoustic waves 140 at consecutive stages of propagation thereof in a modulating region 142 of an acousto-optical modulator such as is associated with one of beam modulating channels 106 (FIG. 6); and to FIGS. 9A–9G which are simplified pictorial illustrations showing various stages, corresponding to stages shown in FIGS. 8A–8G, of exposure of a run of pixels 144, comprising pixels 146, 148, 150 and 152, on a substrate 40, such as a photoresist-clad PCB, to be exposed in accordance with an embodiment of the present invention. Shading in run 144 indicates exposure by a laser beam pulse. FIGS. 8A–9G are illustrative of an exemplary method that may be employed to minimize timing errors, which method is applicable even when the number of laser pulses available to expose a pixel in a quasi CW modulation configuration falls below an average of two pulses per pixel, and approaches or is less than one pulse per pixel or less. As seen in FIGS. 8A–9G, a sequence of about 7 consecutive pulses is employed to expose a linear region of four pixels, corresponding to an average of about 1.75 pulses per pixel.

Each of FIGS. 8A–8G represents an instantaneous snapshot of the state of an acoustic wave 140 used to modulate a beam portion 118 (FIG. 6) at a moment in time corresponding to the presence of a laser beam pulse. Thus, each of FIGS. 8A–8G are separated in time by between 3–50 nano seconds, and generally by about 12.5 nanoseconds, depending on the laser pulse repetition rate. In some embodiments of the invention, the width of a modulating active region 142 corresponds (after appropriate de-magnification by optics) to between 2–5 pixels to be imaged on substrate 40, and ideally to about 3 pixels. As seen, the generation of an acoustic wave 140 in an acousto optic modulator is not instantaneous, but rather the acoustic wave 140 propagates across modulating active region 142 in a direction 156 at a rate that is a function of the physical properties of the material forming modulating active region 142. Moreover, as seen in FIGS. 8A–10G, the edge of the acoustic wave can be imaged onto a substrate by laser beam pulses, to form an edge of a feature to be written at a fixed position, even without filling the entire modulating active region 142. Typically an acoustic wave is suitable to be imaged to form an edge on a substrate, after beginning to propagate through modulating active region 142, in the space of less than one pixel, although in some embodiments a span of greater than 1 pixel may be required.

Reference is now made to FIGS. 9A–9G. In accordance with some embodiments of the present invention, an image 158 of modulating active region 142, which for simplicity of illustration is shown above a region being scanned, is scanned across substrate 40 at a velocity substantially equal and opposite in direction to the velocity of propagation of the imaged wave 140 in modulating active region 142. Ideally, there will be less than a ±25% difference in respective rates of progression and propagation. Scanning direction 124 is opposite to the direction 156 in which wave 140 propagates. As seen in FIGS. 9A–9G, a segment of a laser beam 160 is present in image 158. It is seen that segment 160 corresponds to the location of wave 140 in modulating active region 142, and the size of the spot of each flash varies over time as a function of the position and location of wave 140 in modulating active region 142. In the schematic representation shown in FIGS. 9A–9G, image 158 serves as a scanning window and acoustic wave 140 serves as an aperture that allows all or part of the window to be filled by an incoming laser beam. Pixels 146–152 are exposed by a succession of nearly instantaneous laser pulses. The region of substrate 40 exposed by a pulse is determined by the instantaneous location of image 158 and the segment 160 of the modulating acoustic wave 140 relative to substrate 40. The energy profile is determined by the overlap between the segment 160 and the laser beam profile 130 which is fixed relative to image 158.

It is appreciated by persons skilled in the art that the pictorial representation in FIGS. 9A–9G is schematic inasmuch as sharp edges are depicted. In actuality the size and profile of the spot formed by segment 160 which reaches substrate 40 are largely dictated by diffraction effects and optical aberrations of the system. Edge blurring occurring in the exposure process may be compensated in subsequent development processes of the photosensitive recording medium forming substrate 40 such that blurring as described hereinabove does not detract from the generality and validity of the foregoing schematic description.

Moreover, as appreciated by persons skilled in the art, inasmuch as the velocity of propagation of wave 140 and the velocity of scanning of image 158 are substantially equal but in opposite directions, front edge 162 and rear edge 164 of wave 140 substantially fix the location at which segment of laser beam 160 writes edges 166 and 168 of a run of pixels 144. It is noted that inasmuch as the velocity of image 158 is equal and opposite to the velocity of wave 140, the fixing of an edge is independent of the distance traversed by image 158 between flashes. Thus edges 166 and 168 are fixed irrespective of whether image 158 progresses between flashes by a whole number of pixels or any number of partial pixels.

Thus in accordance with some embodiments of the present invention, the location of a run of exposed pixels 144 is substantially independent of the average number of laser pulses by which a pixel 146–152 is exposed or any synchronization between the pulse repetition rate and velocity at which a beam or an image 158 is scanned. Thus pixels are exposed or not exposed as a function of the accumulated energy delivered to a pixel 146–152 by successive pulses.

Reference is now made to FIGS. 10A–10G which are energy graphs showing laser exposure energy profiles along run of pixels 144 corresponding to each of the stages of exposure shown in FIGS. 9A–9G. It is noted the region under no single curve 170–182 coincides with an individual pixel 146–152, however the region under all of the curves 170–182, taken together coincides with run of pixels 144 to be exposed. Moreover, summation of the individual exposure profiles 170–182 in FIG. 10G results in a substantially uniform level of energy provided to all of pixels 146–152 in run 144.

In summary, as seen in FIGS. 8A–10G, an acoustic wave 140 that modulates data propagates in the medium forming modulating active region 142 over a defined non-instantaneous interval of time; the presence and extent of the acoustic wave 140 in modulating active region 142 changes over time; and multiple pulses impinge on modulating active region 142 during the time that wave 140 is present therein such that the acoustic wave deflects to substrate 40 a laser beam segment 160 having a shape that changes according to the change in shape of wave 140 in modulating active region 142. Moreover, as seen in FIGS. 9A–9G, the region in a raster image exposed by each pulse partially overlaps regions exposed by previous pulses; the size of a segment of each pulse that is deflected by acoustic wave 162 varies as a function of its location in a pattern to be written, for example its proximity to an edge 166 and 168; the size of the region exposed by each pulse is smaller than the run of pixels to be exposed; a run of pixels is exposed by a plurality of pulses and each pulse exposes a region smaller than run of pixels; the total exposure of a run of pixels is the summation of the exposure by the plurality of mutually overlapping pulses.

Reference is now made to FIGS. 11A–11G which are simplified pictorial illustrations of an acoustic wave 140 at consecutive stages of generation thereof in the modulating active region 142 of an acousto-optical modulator crystal such as is associated with one of beam modulating channels 106 (FIG. 6); and to FIGS. 12A–12G which are simplified pictorial illustrations showing various stages, corresponding to stages shown in FIGS. 11A–11G, of exposure of a run of pixels 144, comprising pixels 146, 148, 150 and 152, on a substrate 40, such as a photoresist clad PCB, to be exposed in accordance with an embodiment of the present invention.

Shading in run 144 indicates exposure by a laser beam pulse. FIGS. 11A–12G are generally similar to, and self explanatory, in view of the description with respect to FIGS. 8A–9G.

It is noted however that while FIGS. 11A–11G show the propagation of an acoustic wave 140 at times separated by the same intervals as in FIGS. 8A–8G, a laser pulse is present only at the times corresponding to stages shown in FIGS. 11A, 11C, 11E and 11G. Thus, the time interval between each of pulses in FIGS. 11A–11G is twice the time interval between pulses in FIGS. 8A–8G. It is thus seen that a laser beam segment 160 is present to expose part of run 144 only in images 158 shown in FIGS. 12A, 12C, 12E and 12G. Thus as shown in FIGS. 12A–12F, 4 pulses expose run 144, which comprises 4 pixels, while the integrity of the location of edges 166 and 168 in run 144 is maintained.

Reference is now made to FIGS. 13A–13G which are energy graphs showing accumulated laser energy along run of pixels 144 at each of the stages of exposure shown in FIGS. 12A–12G. FIGS. 13A–13G generally are similar to, and self explanatory, in view of the description with respect to FIGS. 10A–10G. It is noted however that although fewer pulses expose run 144, the accumulation of energy over run 144 is at least partially evened out by the overlapping of laser pulses. All parts of run 144 that exceed a minimum energy threshold will thus be exposed. It should be noted that some portions of the exposed area are exposed by more than one pulse and that the number of pulses that expose a portion may be as low as one, for some embodiments of the invention. It should also be noted that the portions may be exposed by different spatial regions on the pulse. These effects and the exposure necessary to expose a pixel may determine the lowest pulse rate which will result in satisfactory pattern writing.

Reference is now made to FIGS. 14A–14G which are simplified pictorial illustrations of an acoustic wave at consecutive stages of generation thereof in the modulating active region of an acousto-optical modulator such as is associated with one of beam modulating channels 106 (FIG. 6); and to FIGS. 15A–15G which are simplified pictorial illustrations showing various stages, corresponding to stages shown in FIGS. 14A–14G, of exposure of a run of pixels 144, comprising pixels 146, 148, 150 and 152, on a substrate 40, such as a photoresist clad PCB, to be exposed in accordance with an embodiment of the present invention. Shading in run 144 indicates exposure by a laser beam pulse. FIGS. 14A–15G are generally similar to, and self explanatory, in view of the description with respect to FIGS. 8A–9G and FIGS. 11A–12G.

Figure 14D:
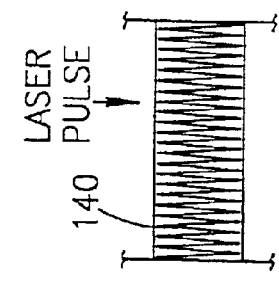
Figure 14E:
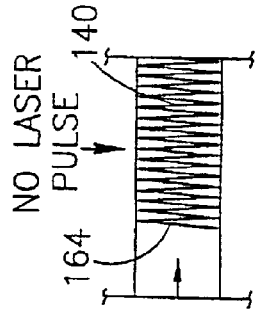

It is noted however that while FIGS. 14A–14G show the propagation of an acoustic wave 140 at times separated by the same intervals as in FIGS. 8A–8G, a laser pulse is present only at the times corresponding to stages shown in FIGS. 14B, 14D and 14F. Thus, the time interval between each of pulses in FIGS. 14A–14G is equal to the time interval in FIGS. 11A–11G and twice the time interval between pulses in FIGS. 8A–8G. It is thus seen that a laser beam segment 160 is present to expose part of run 144 only in images 158 shown in FIGS. 15B, 15D, and 15F. Thus as shown in FIGS. 15A–15F, although the time interval between pulses is the same as in FIGS. 11A–11G, the pulse timing is offset relative thereto such that only 3 pulses expose run 144. It is thus appreciated that in accordance with these embodiments of the present invention the integrity of the location of edges 166 and 168 in run 144 is maintained independently of the time interval between pulses and the time when a pulses arrives respective to the relative locations of image 158 and a run 144 of pixels to be exposed.

Reference is now made to FIGS. 16A–16G which are energy graphs showing laser energy profiles along run of pixels 144 at each of the stages of exposure shown in FIGS. 15A–15G. FIGS. 16A–16G are generally similar to, and self explanatory, in view of the description with respect to FIGS. 10A–10G and 13A–13G. It is noted however that although only three pulses expose run 144, the accumulation of energy over is at least partially evened out by the overlapping of laser pulses. All parts of run 144 that exceed a minimum energy threshold will thus be exposed.

It is noted that inasmuch as some portion of a pulse impinges on modulating active region 142 while front edge 162 or rear edge 164 of acoustic wave 140 is present therein, if the sum total of energy is sufficient to expose a pixel, then the location of edges 166 and 168 is generally insensitive to the time at which a pulse impinges thereon or the location of front edge 162 or rear edge in modulating medium 142.

It is appreciated that the limiting condition of exemplary embodiments described hereinabove operative to fix the edge of an exposing pulse relative to the edge of a run of pixels to be exposed, is the delivery of sufficient laser energy by multiple pulses to expose a pixel. Thus in accordance with some embodiments of the present invention a multi-channel modulator is employed to modulate separate portions 118 of beam 12 (FIG. 6), and subsequent scans of beam 12 are made to partially overlap previous scans on substrate 40. Each line of pixels to be exposed is thus addressed by a different channels in modulator 102 in at least two subsequent scan passes, such that in subsequent overlapping scans additional pulses are delivered to a run of pixels to be exposed to ensure a substantially even and sufficient quantity of laser energy is delivered to each pixel to be exposed.

Various configurations of apparatus to increase the pulse repetition rate of pulsed lasers and to write raster images using pulse lasers, as shown in FIGS. 1–5 are shown in the above referenced WO 00/11766. However, it is noted that embodiments of the present invention may be carried out with or without such apparatus to increase the pulse repetition rate. Moreover, embodiments of the present invention may be carried out with or without the sub-systems and methodologies described herein and used to accommodate a pulse repetition rate that is slower than the data rate. Consequently, embodiments of the present invention may be carried out in any suitable system in which the pulse repetition rate is slower than, equal to or greater than the data rate, or in which the pulse repetition rate is synchronous or asynchronous with the data rate.

Figure 17:
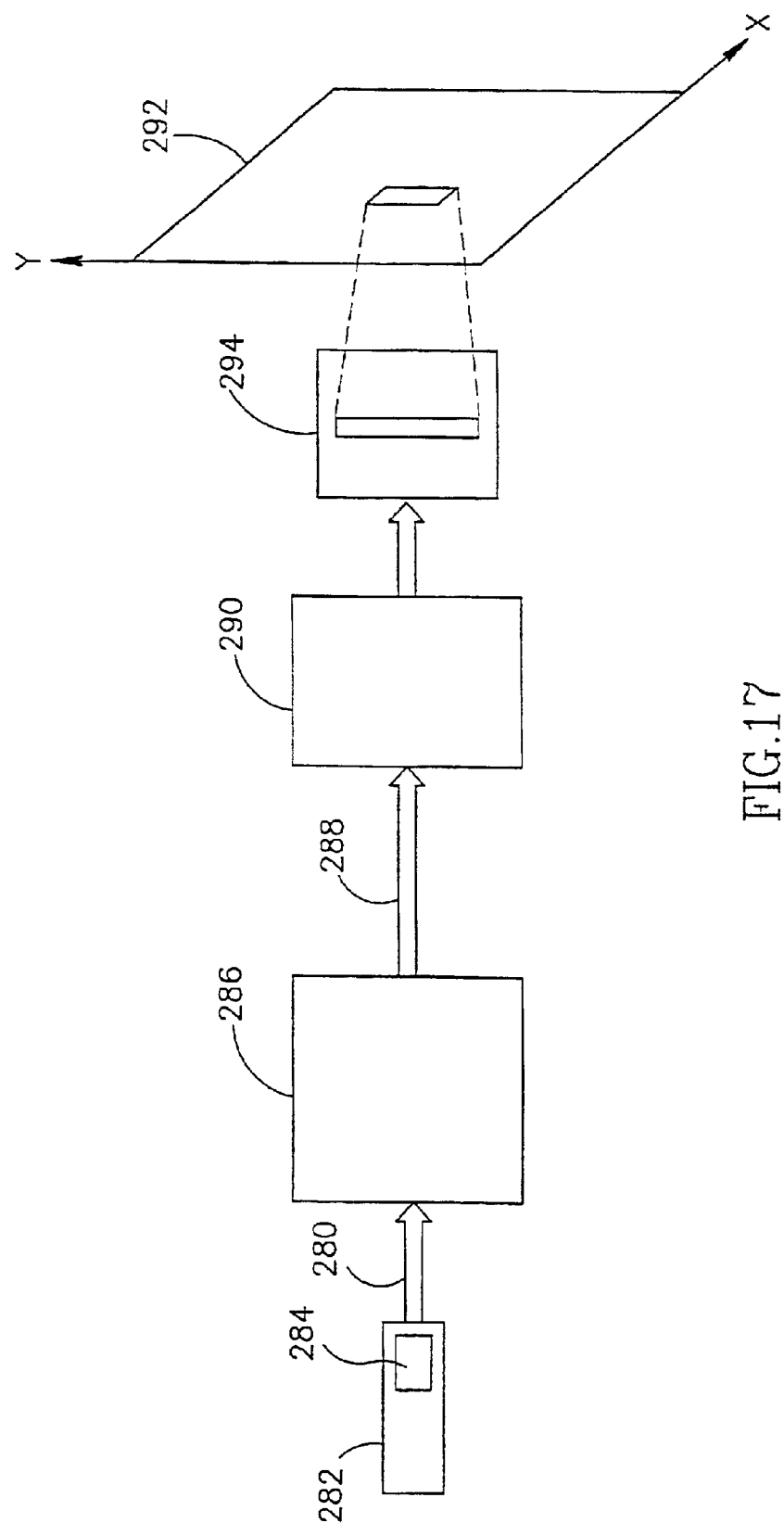
FIG. 17 is a schematic diagram showing the way some embodiments of the present invention are integrated in a PCB production line.

Reference is now made to FIG. 17 which is a schematic diagram illustrating integration of the present invention into a PCB production line. Linearly polarized and pulsed UV laser beam 280 is, for example, generated by a high power mode-locked IR laser 282 and passed through a frequency converter 284 operative to convert the frequency of laser 280 by harmonic generation. For example beam 280 is obtained from a VANGUARD™ UV pulsed laser available from Spectra-Physics and having a wavelength of about 355 nm and a pulse rate of about 80 MHz. Alternatively, beam 280 may be obtained from a Millennia laser, of Spectra Physics Lasers, at 532 nm wavelength which pumps a Tsunami mode-locked Ti:saphire laser also from Spectra-Physics Lasers. The output beam of the Tsunami mode-locked Ti:saphire laser is frequency doubled, for example by an LBO crystal, available from Fujian Casix Laser Inc. of China, external to the laser cavity, to about 390 nm. The repetition rate of the IR laser is, for example, about 82 MHz and its wavelength is around 780 nm. In accordance with some embodiments, the pulse repetition rate of UV beam 280 is multiplied (e.g. 2×, 4×, etc.) by a pulse rate multiplication device 286, such as pulse rate multiplication devices 50 and 215 described above, however this element is not required in order to carry out the invention. Output beam 288 exiting from device 286 impinges on an optical writing device 290, and is scanned across the surface of a photoresist clad PCB 292, used in the production of PCBs, by the joint action of a polygon mirror 294, in the direction of X and the lateral displacement of the PCB 292, in the direction of Y. In an exemplary embodiment, the beam 288 is spread into a line and portions thereof are independently modulated as described above. It is appreciated that if the data rate at which beam 288 is modulated by optical writing device 290 is sufficiently low compared to the pulse data rate of beam 288 the use of a pulse rate multiplication device 286 is obviated. This may occur for example if optical writing device simultaneously independently modulates a plurality of spatial portions of beam 280.

Thus, in some embodiments of the invention the pulse repetition rate of input beam 280 may vary between 80 MHz (for no repetition rate doubling) and 320 MHz for repetition rate quadrupling or more for greater multiplication, while the ratio of pulses to data may vary between an average 0.75 pulses (or less) to 8 pulses per pixel to be written. It is generally preferable to employ a modulator operative to fix an edge of a region to be written during exposure by multiple laser beam pulse, particularly when a low pulse to data ratio is used.

As indicated above, pulsed exposure can be used in the laser writing system described in WO 00/02424, however in order to expose a pattern in a desired manner, it is necessary to accurately determine the location of a laser beam along a scan axis, as it is being scanned. This is not trivial when the laser beam is pulsed. To further describe the application of pulsed laser writing to the direct writing system of WO 00/02424 FIGS. 1–3 and 9–14 (renumbered as FIGS. 18–26) are included herein. An adaptation of the text associated with the figures follows. For ease of comparison, the 1000 has been added to the reference numbers in the Figs.

System Overview

Figure 18:
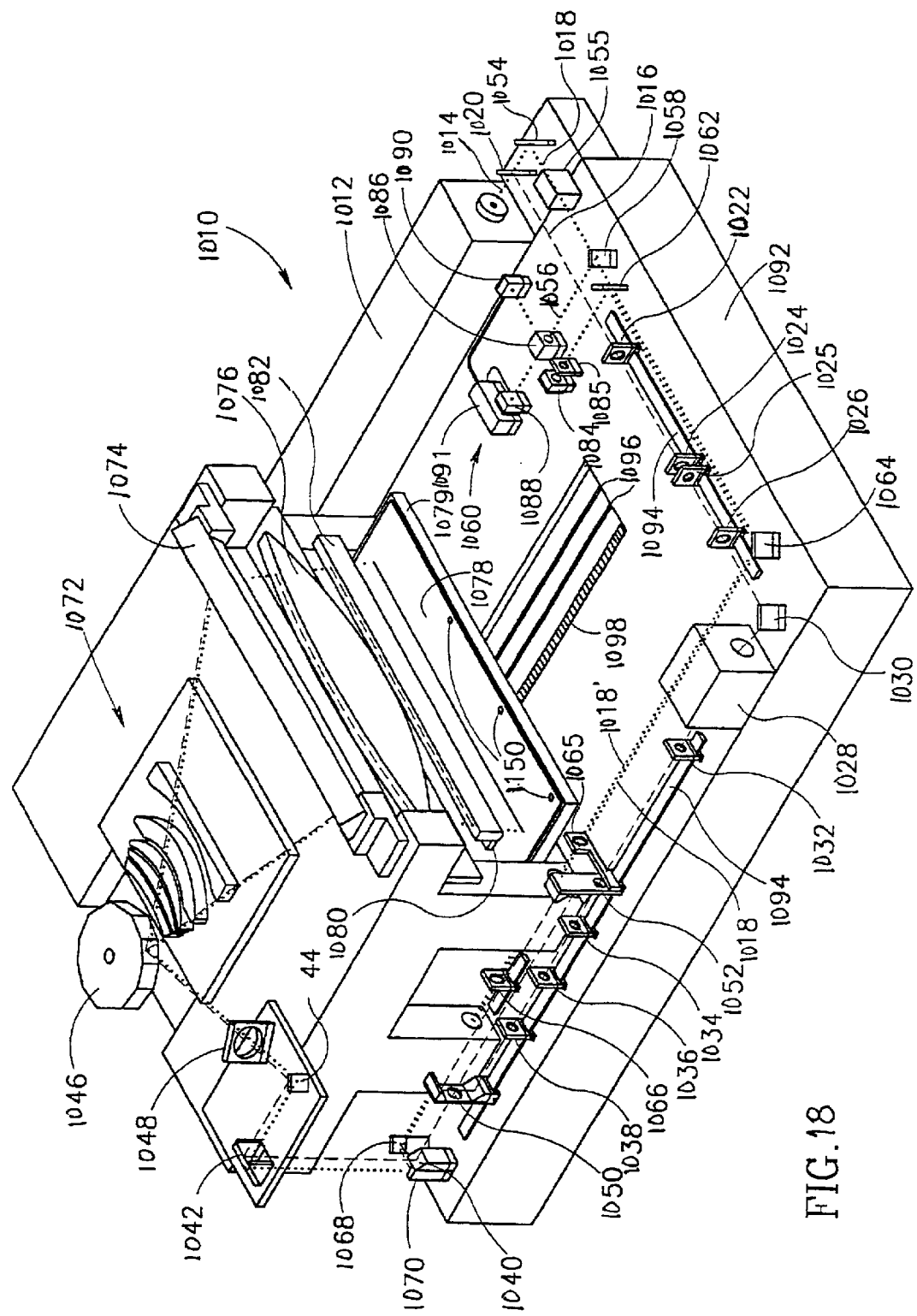
FIG. 18 is a schematic perspective view of a printed circuit board direct writing scanner in accordance with an exemplary embodiment of the invention.
Figure 19:
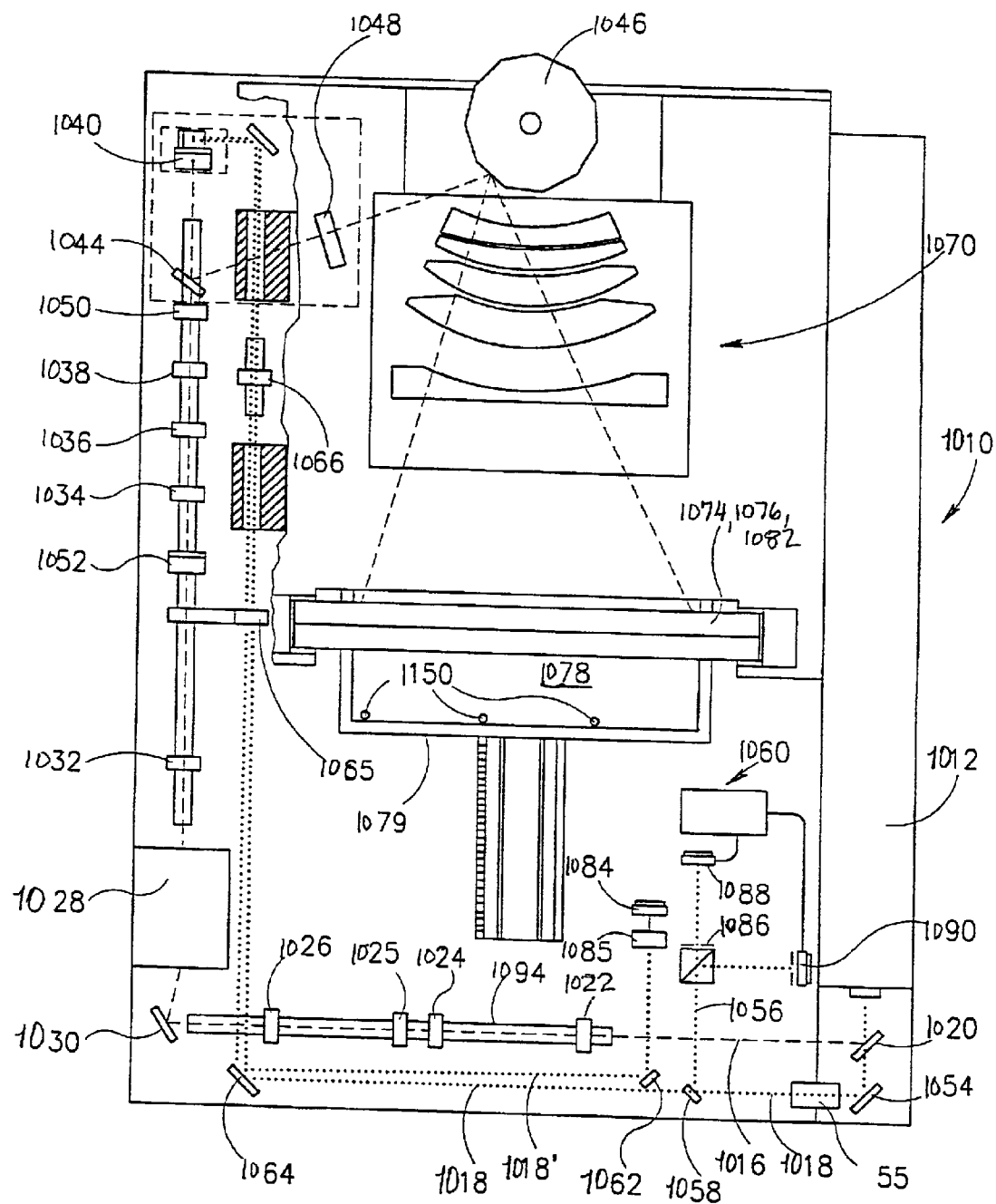
FIG. 19 is a schematic top view of the scanner of FIG. 18.
Figure 20:
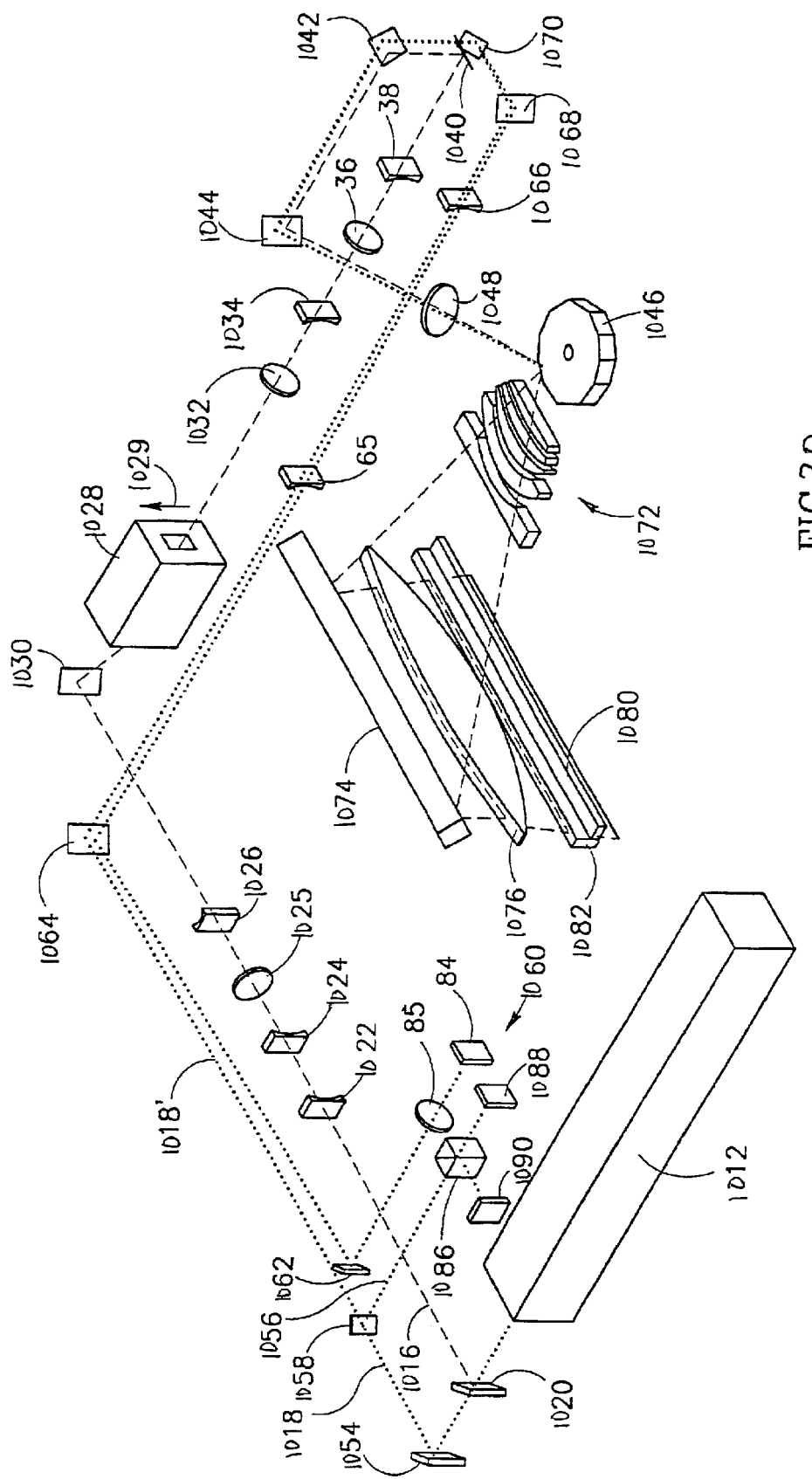
FIG. 20 is a schematic view of the scanner of FIGS. 18 and 19 in which the elements of the scanner are shown without mounts and not to scale, for clarity of presentation.
Figure 26:
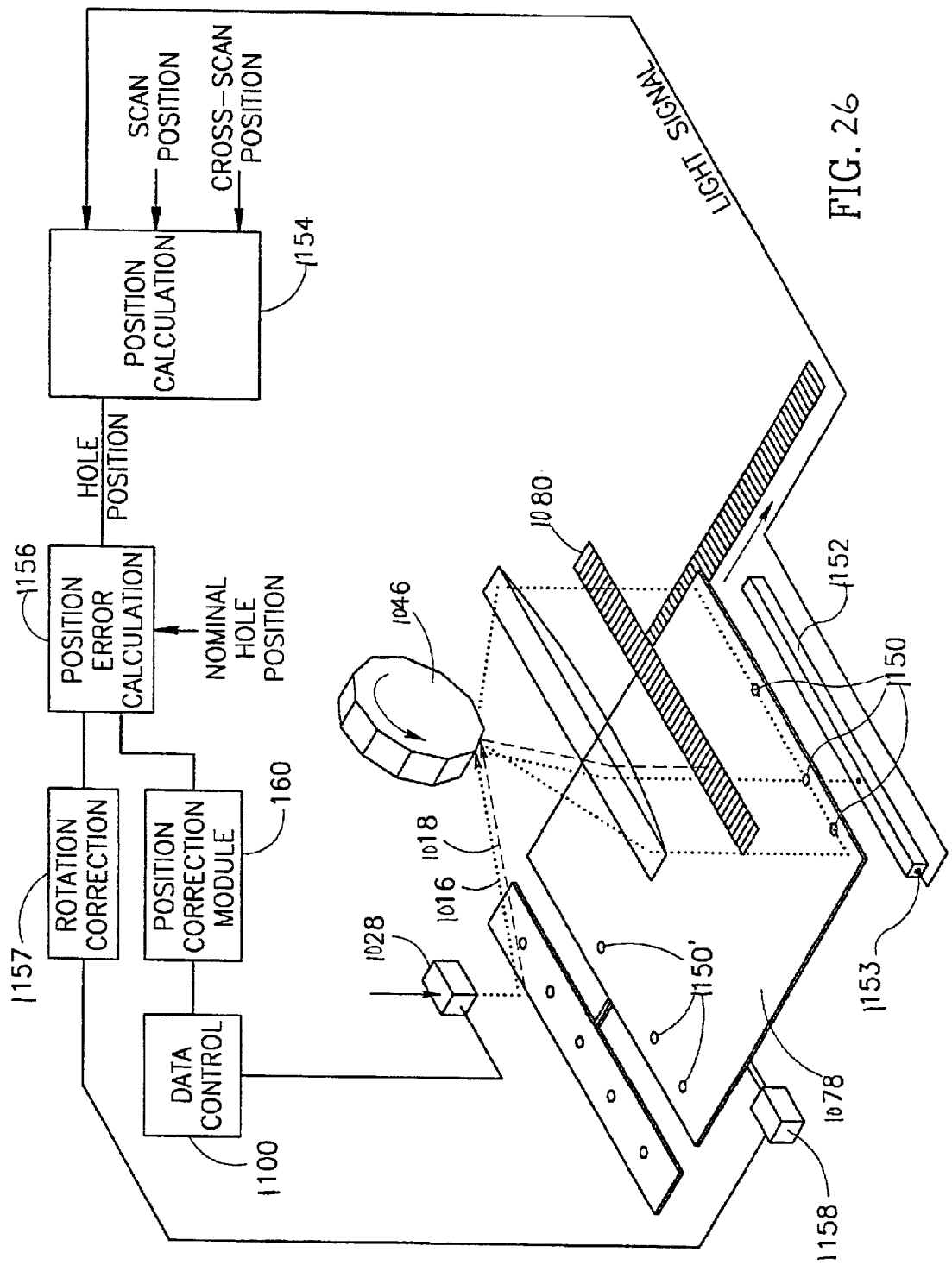
FIGS. 26 and 27 are simplified schematic drawings illustrating inter alia a structure used for determining position of a beam in a scan direction, in accordance with an embodiment of the invention.
Figure 27:
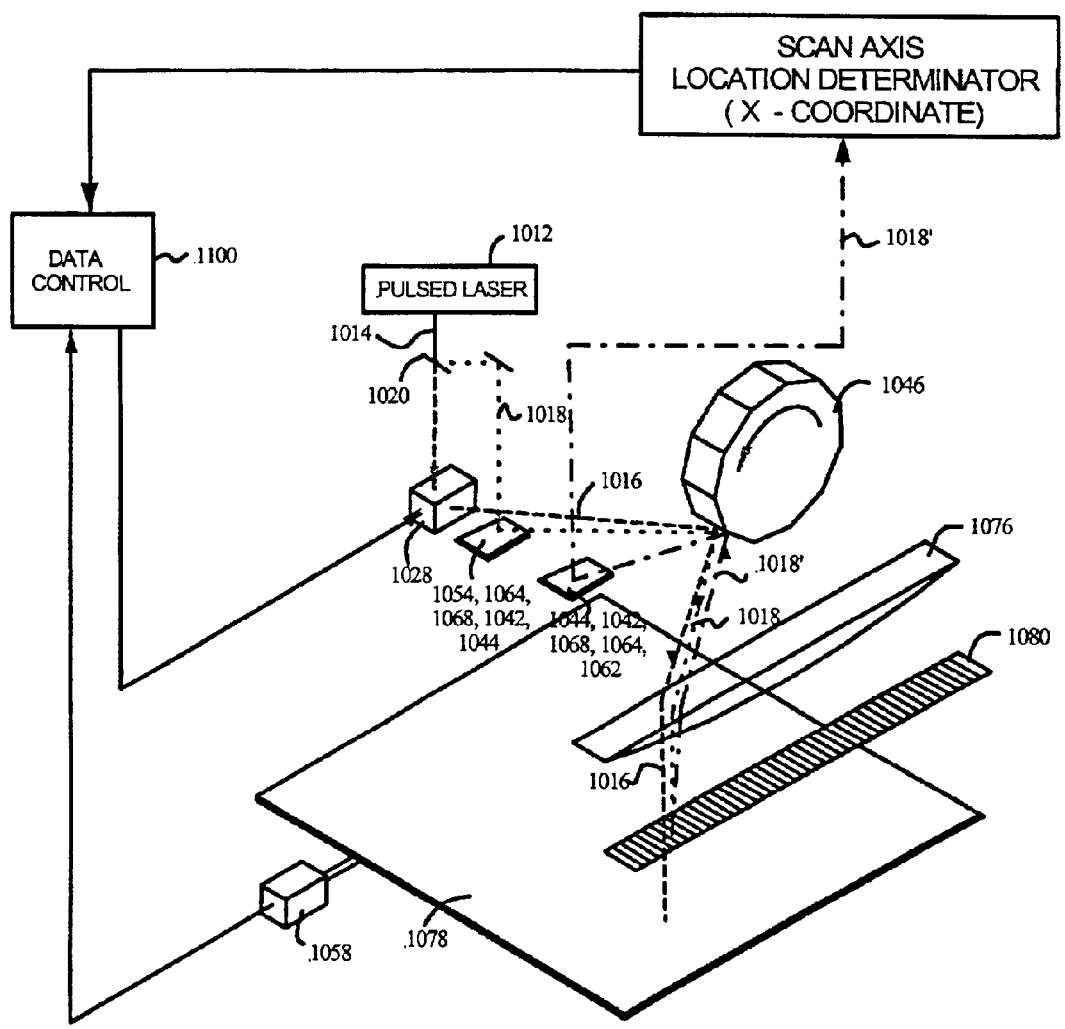

Reference is made to FIGS. 18–20 which show an exemplary direct writing printed circuit board scanner 1010, in accordance with an exemplary embodiment of the invention. Scanner 1010 comprises a pulsed laser source 1012, whose output wavelength is suitable for exposing a photoresist coating. FIGS. 26 and 27 show the system for deriving a scan position in greater detail. Note that multiple elements are combined in FIG. 27, whose geometry has been simplified for clarity. In an embodiment of the invention, an ultraviolet laser system, as described above and operating at 355 nanometers and delivering a maximum power of about 4 watts at about 80 MHz has been found suitable. A suitable laser is the VANGUARD™ mode locked pulsed laser mentioned above. It is appreciated that any other laser having a similar or different output may be used provided that it is compatible with the photoresist material being used. A beam 1014 exits pulsed laser source 1012 and is split into two beams, a main beam 1016 and a test beam 1018, by a first beam splitter (or partially reflective mirror) 1020. As explained below, main beam 1016 (shown as a dashed line), is (eventually) used to scan and expose the photoresist on the printed circuit board. Test beam 1018 (shown as a dotted line) is used to determine the scan position of main beam 1016 and for certain other test and alignment functions as will be described below. Optionally, splitter 1020 and the mirrors and other splitters described below are front surface mirrors and splitters. Optionally, the mirrors and splitters are dielectric front surface mirrors.

Since the power required for testing is much lower than that for writing, beam splitter 1020 preferably reflects much more power than it transmits. Optionally of the order of 99% of the power of beam 1014 is reflected into main beam 1016. In the following explanation, the two directions perpendicular to the propagation axis of the beam are designated as the "scan direction" and the "cross-scan direction". These directions correspond to the direction of scanning of the writing beam, which is along a scan axis, and the direction perpendicular to both the beam axis and the scan direction, respectively. It should be understood that the full import of this nomenclature becomes clear below.

For ease of explanation, the optical path of main beam 1016 is discussed first. Main beam 1016 is passed through a series of optical elements 1022, 1024, 1025 and 1026 (seen in FIG. 18) whose function is to focus the beam on a modulating surface within a modulator 1028 after the beam's reflection from a first mirror 1030. For the exemplary embodiment of FIGS. 18–20, these elements are a first cross-scan cylindrical lens 1022, a second cross-scan cylindrical lens 1024, a first spherical lens 1025 and a first scan cylindrical lens 1026. Moreover, while beam 1016 is substantially round after reflection from first splitter 1020, it is oblong when it enters modulator 1028, being longer in the cross-scan direction than in the scan direction. As the beam passes through modulator 1028, segments of the beam in the cross-scan direction are independently modulated by modulator 1028. Such a beam may be considered to comprise a plurality of separately modulated beams traveling side by side. However, for ease of visualization only a single beam path is shown for main beam 1016. The cross-scan direction is the vertical direction at the exit from modulator 1028 (as indicated by reference number 1029 on FIG. 20.

Although the main beam is described, in the exemplary embodiment, as being a single beam comprising a plurality of separately modulated sub-beams, it is readily understood that, for some aspects of the invention, beam 1016 could be formed of a plurality of discrete beams, produced, for example by beam splitters, a plurality of laser emitters or other suitable means.

It may be noted that, for this exemplary embodiment, first mirror 1030 does not reflect main beam at 90°. Rather, beam 1016 is reflected from mirror 1030 at an acute angle and it impinges on modulator 1028 at an angle different from the angle with which it leaves the modulator. Modulator 1028 is, for example, an acousto-optic modulator as well known in the art and as described in "Design and Fabrication of Acousto-optic Devices," pages 94 ff., edited by Akis P. Goutzoulis and Dennis R. Papa, published by Marcel Dekker, Inc., 1994, which is incorporated herein by reference. After modulation, the beam must be further optically processed, for example, through an anamorphic lens system, to prepare it for scanning. In the exemplary embodiment of FIGS. 18–20 and 27, the pulsed beam is first passed through a second spherical lens 1032, then successively though a third cross-scan cylindrical lens 1034, a third spherical lens 1036 and a fourth cross-scan cylindrical lens 38. Main beam 1016 is then reflected from second third and fourth mirrors 1040, 1042, and 1044. After reflection from mirror 1044, beam 1016 is aimed at a facet of a rotating polygon 1046. The beam passes through a lens 1048 prior to impinging on polygon 1046. As indicated below, the z-position of lens 1036 may be adjusted to (for example by movement of a motorized mount, not shown) focus the beam on different thicknesses of PC board. The lenses may be of fused silica or other suitable optical material.

It will be noted from FIG. 18 that after passing through lens 1038, beam 1016 is folded over by reflector sets 1050 and 1052 (not shown on FIG. 20 for simplicity of visualization). The object of these reflectors is to increase the beam path length and increase the size of the beam, such that the optical power density on the optical surfaces is decreased.

It will be further noted that, for the exemplary embodiment, the focusing in the cross-scan direction is much greater than that in the scan direction. In an exemplary embodiment of the invention, beam 1016 is focused in the cross-scan direction on the facet which reduces errors caused by polygon wobble and is defocused (collimated) in the scan direction such that the facet is well underfilled, so as not to lose power.

Turning to the path of test beam 1018. After passing through first beam splitter 1020, test beam 1018 is reflected by a fifth mirror 1054 such that its path is preferably substantially parallel to that of main beam 1016. A beam rotator 1055 preferably rotates beam 1018 by 90° about its axis. Other than the rotation, the rotator, which may be a series of mirrors, preferably does not change the axis of beam 1016.

A portion 1056 of beam 1018 is split off the test beam by a second splitter 1058 and directed toward laser alignment apparatus 1060, whose operation is described below. In an exemplary embodiment of the invention, splitter 58 is a 50—50 splitter, although substantially different ratios may be used. Beam 1018 passes to the side of a sixth mirror 1062 and impinges on a seventh mirror 1064 which reflects it so that it is preferably substantially parallel to beam 1016, after that beam leaves modulator 1028. It will be noted that beams 1016 and 1018 are relatively far apart on this leg of their path. Beam 1018 is subjected to focusing in the cross-scan direction by Two cylindrical lenses 1065 and 1066. A mirror pair 1068, 1070 reflect beam 1018 so that it too is reflected by mirrors 1042 and 1044 toward polygon 1046 via lens 1048. However, beams 1016 and 1018 are no longer parallel when they reach mirror 1042. Mirror 1070 is optionally placed at an angle such that beams 16 and 18 are traveling at an angle, towards each other. Preferably, the angle is such that the beams are substantially coincident at the facet of polygon. After reflection from the facet, they diverge.

It will be noted that beams 1016 and 1018 optionally lay in a vertical (cross-scan) plane as they leave mirror 1042. This assures that they will scan at substantially the same scan position along the scan axis after reflection from the polygon facet. Beam 1018 is thus, for example, above beam 1016 prior to impingement on polygon 1046 and below beam 16 after reflection from polygon 1046.

Unlike main beam 1016, which underfills a single facet, test beam 1018 is optionally focused at the facet, in the cross-scan direction and overfills more than two facets in the scan direction. When the polygon rotates, main beam 1016 is traced on the facet as described below. At the same time, the facet cuts part of beam 1018 out of the total beam. As test beam 1018 is Gaussian, the total power of this cut part changes with scan angle.

Scanning optics 1072 focuses both beams as they are scanned across optics 1072 by polygon 1046. In general, optics 1072 is spherical optics such that it substantially focuses both beams in the scan and cross-scan directions. The beams are reflected by a scanning mirror 1074 toward a lens 1076. Beam 1016 impinges a photoresist coated printed circuit board 1078 after passing through a cylindrical (cross-scan) lens 1082. Lens system 1072 together with lens 1076 forms a quasi-f-θ optic system that converts the angular variation imparted to the beam by the polygon to linear movement across the board.

Beam 1018, which has meanwhile diverged from beam 1016, impinges on a scale 1080 without passing through cylindrical lens 1082. It should be noted that the scan position of beams 1016 and 1018 are substantially identical such that a measurement of the scan position of test beam 1018 defines the position of beam 1016.

Scale 1080 is optionally oriented at a slight angle (about the scan direction axis) from the normal of the direction of beam 1018. In this way, while beam 1018 is reflected from the scale in almost the same direction as it arrived at the scale, a slight angle is introduced between the incoming and reflected beams. For clarity of exposition, the reflected beam is denoted as beam 1018' in the description and in the drawings, where feasible.

Beam 1018' passes through lens 1076, mirror 1074, optics 1072, polygon 1046, lens 1048, mirrors 1044, 1042, 1070 and 1068 and through lenses 1066 and 1065 to mirror 1064. By the time the beam reaches mirror 1062, beams 1018 and 1018' are separated such that mirror 1062 intercepts beam 1018' and reflects it, through a lens 1085, to a detector 1084. Detector 1084, which is part of an X-coordinate location determinator (seen in FIG. 27) that is operative to indicate a location of beam 1016 along the scan axis, detects modulation imposed on the beam by markings on scale 1080. At least partially in response to such modulation, the presence of beam 1018, and thus the presence of beam 1016, is determined during the scanning at a multiplicity of locations along the scan axis. These detected signals, which contain information on the position of scanning beam 1016, are optionally used to control the modulation of beam 1016 by modulator 1028, as described below, as part of a data control unit 1100.

Returning now to beam 1056 that is derived from test beam 1018 by splitter 1052. Beam 1056 impinges on a beam splitter 1086, optionally after passing through a first spherical lens (not shown). One portion of the beam is sent, optionally after passing through a second spherical lens (not shown) to a first quadrapole detector 1088. The first and second spherical lenses project the waist of the laser beam onto detector 1088, such that signals from detector 1088 indicate deviations of the beam in scan and cross-scan dimensions.

A second portion of beam 1056 is sent by beam splitter 1052 to a second quadrapole detector 1090, via a pair of lenses (not shown, for clarity). The pair of lenses is configured to operate as an f-θ lens, such that signals from detector 1090 show angular deviations in both the scan and cross-scan directions. Optionally, circuitry 1091 receives the signals and passes them to a system controller.

When the system is originally aligned, the detectors are positioned and adjusted such that their deviation signals are all zero. When the laser is replaced, the entire system need not be realigned. It is sufficient to place the laser in its mount and to adjust its height and angular positions such that both detectors 1088 and 1090 produce a zero deviation signal. Such a zero deviation signal will be produced only when the laser is appropriately aligned to produce a beam having precisely the same beam path as the laser with which the system was originally aligned. The result of aligning the laser is that the entire system is aligned.

Optionally, the system is mounted on a synthetic granite base 1092, for stability. Many of the components are optionally mounted on rails 1094, utilizing mounting methods as described in PCT Patent publication WO 00/55592. the disclosure of which is incorporated herein by reference. This mounting scheme allows for the easy replacement of components without realignment of the entire optics, or even of the replaced component.

In accordance with some exemplary embodiments of the invention, an improved optical system is provided. This optical system can be subdivided into two parts, in accordance with their different functional tasks: the Modulator Illumination System, and the Modulator to Printed Circuit Board Imaging System. The system can also be subdivided into pre-scanning optics and scanning optics. The pre-scanning optics comprises all lenses, situated between the laser and the polygon. The scanning optics comprises the optics between the polygon and the board plane. This division is desirable because of the very different requirements for these two parts. The elements of the pre-scanning optics are small in size, since the beam is small. However, the power density is high which may cause problems.

For the scanning optics the requirements with respect to beam size and power density are generally reversed.

Further details of the main beam optical system can be found in WO 00/02424

Scan Direction Position Measurement

One of the most critical elements in accurate direct laser writing of PC boards in a direct imaging system is knowledge of the position of the beam on the PC board. This knowledge allows for the proper modulation of the beams (or more precisely, the scan lines) with correct data, at the position of the scan lines. The PC board moves in the cross-scan direction and the beam scans in the scan direction. Thus, the position of the beam may be completely determined from knowledge of the cross-scan position of a table 1079 on which PC board 1078 is mounted and of the scan position of the beam along the scan axis.

It is straightforward to determine the cross-scan position of the table. Any of the well-known encoders known in the art may be used. In an embodiment of the invention, the table is transported along two x-shaped rails 1096 and an optical encoder is used for the measurement. A scale 1098, associated with the encoder is shown in FIG. 18. For example, a type LIE 5 encoder system by Numerik Jena GmbH, Jena, Germany; (accuracy 2 $\mu$m, resolution 0.2 $\mu$m) is used. Optionally, the cross-scan position measurement is made to an accuracy of ±2 or 3 micrometers and a resolution of ±0.1 micrometers, although other resolution and accuracy may be used, depending on the system requirements.

It should be noted that each feature on the printed circuit board is written by several segments of beam 16. Thus, knowledge of the cross-scan position can be used to determine modulation of the beam to a positional accuracy greater than the minimum required feature size. The data position may be adjusted to a positional accuracy equal to the scan line spacing, which is generally much smaller than the required accuracy.

The general principals of determining the position of a beam at a plurality of locations in the scan direction was generally described above with reference to FIGS. 18–20 and 27. It is appreciated that it is difficult to determine the scan direction position of the beam with great accuracy. This problem is made somewhat more difficult by the use of a scan speed that varies with position, since this requires more precise control over the data stream from the data source, and is further complicated by use of a pulsed laser beam.

Figure 21:
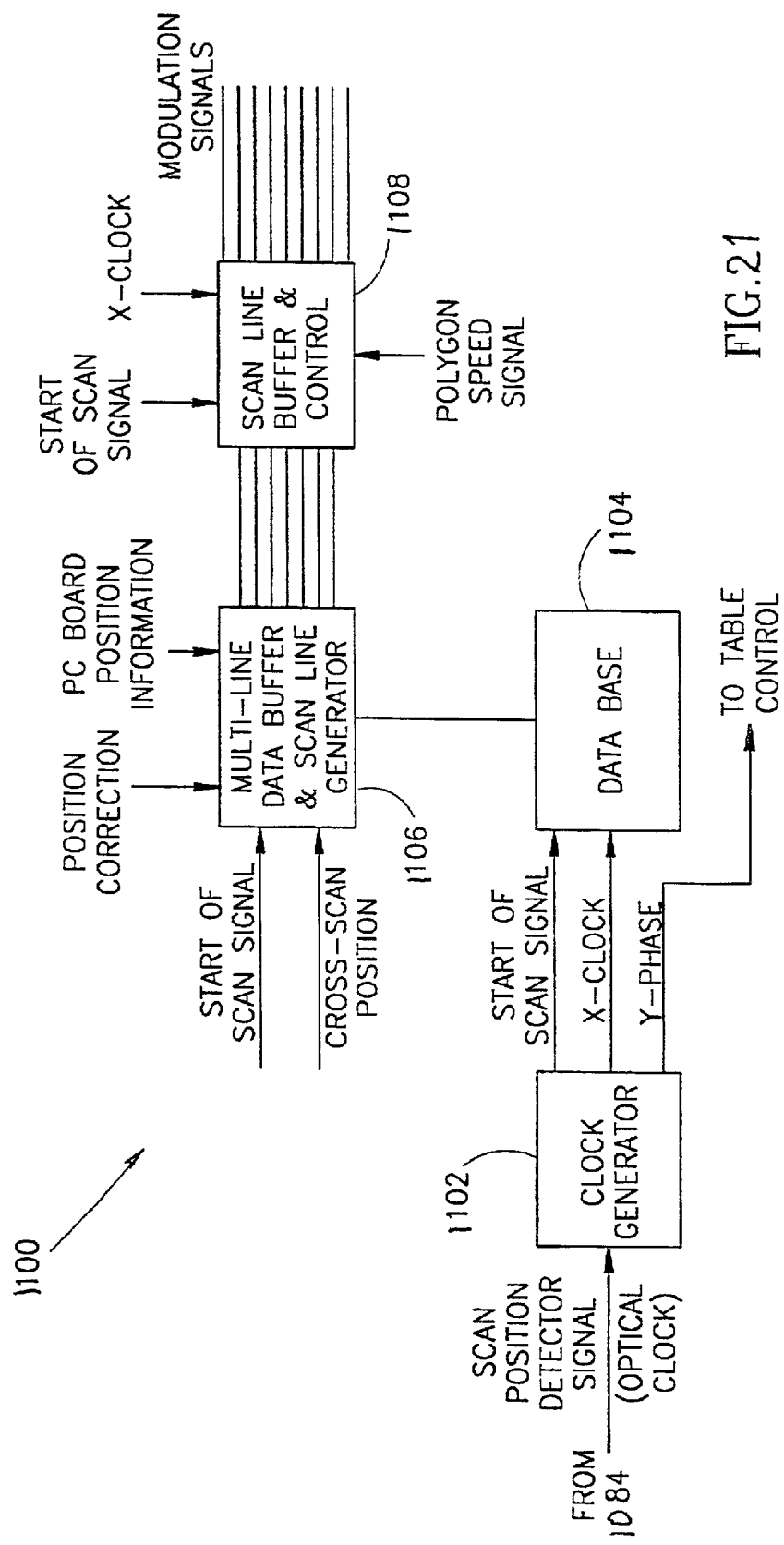
FIG. 21 is a simplified block diagram for a data control system for a scanner in accordance with an exemplary embodiment of the invention.

FIG. 21 is a simplified block diagram for a data control system 1100, for a scanner in accordance with an exemplary embodiment of the invention.

Control system 1100 receives signals from detector circuitry 1084. These signals represent the variations in power of beam 1018' as modulated by the markings on scale 1080. In general, these markings produce an analog signal (the "optical clock") with a relatively low pulse rate, much lower than the data clock rate for the system. The pulse rate in abeam 1018' is thus the result of modulation by markings on scale 1080 and is different from the pulse rate of a pulsed laser beam 12 in FIG. 1. In fact, the pulses of laser beam 12 constitute undesired noise respective of the optical clock resulting from pulses of beam 1018'. A clock generator 1102 generates an X-clock (data clock) and a start of scan signal from the scan position detector signal. An exemplary method of generating the x-clock from the scan signal is described below.

The following features of the clock should be noted however:

1) The average x-clock rate is optionally not constant over the length of the scan.
2) Data is sent to modulator 1028 based on the instantaneous x-clock count and the start of scan signal.

It should be understood that while the data is sent to the modulator in response to the x-clock, there is no data sent except at times for which the beam is in a correct position for writing on the PC board. Thus, for periods during which the beam changes facets or during the beginning or end of the scan, when the beam is not in a writing position, no data is sent to the modulator, which is shut off.

Clock generator 1102 sends an x-clock signal and a start of scan signal to a data base 1104, which contains a binary map of the PC board to be scanned. Alternatively, the data could be in vector form and could be transformed to raster form on-line. This data is optionally in compressed form. The generation of the start of scan signal may be based on a separate detector, which sends a start of scan signal (not shown) to the clock generator. Optionally, the start of scan signal is based on the scan signal itself, for example by long signals generated at the beginning and/or end of a scan.

Clock generator 1102 also sends a y-synch signal to a controller (not shown) This controller controls movement of the table in synchronism with the y-scan signal. This signal, which is synchronized with the start of scan, provides a means for synchronizing the position of the table with the data stream.

Data base 1104 send a plurality of scan lines of data to a multi-line data buffer and scan line generator 1106. Preferably, multi-line data buffer 1106 contains all of the lines of data required for the present scan and for the next scan.

Based on a cross-scan position signal and PC board position information, the multi-line data buffer and scan line generator generates scan line data and transfers the scan line data to scan line buffers and control 1108. This data is fed to the various modulators one bit at a time in response to the clock, starting at a time dependent on the start of scan signal.

Figure 22A:
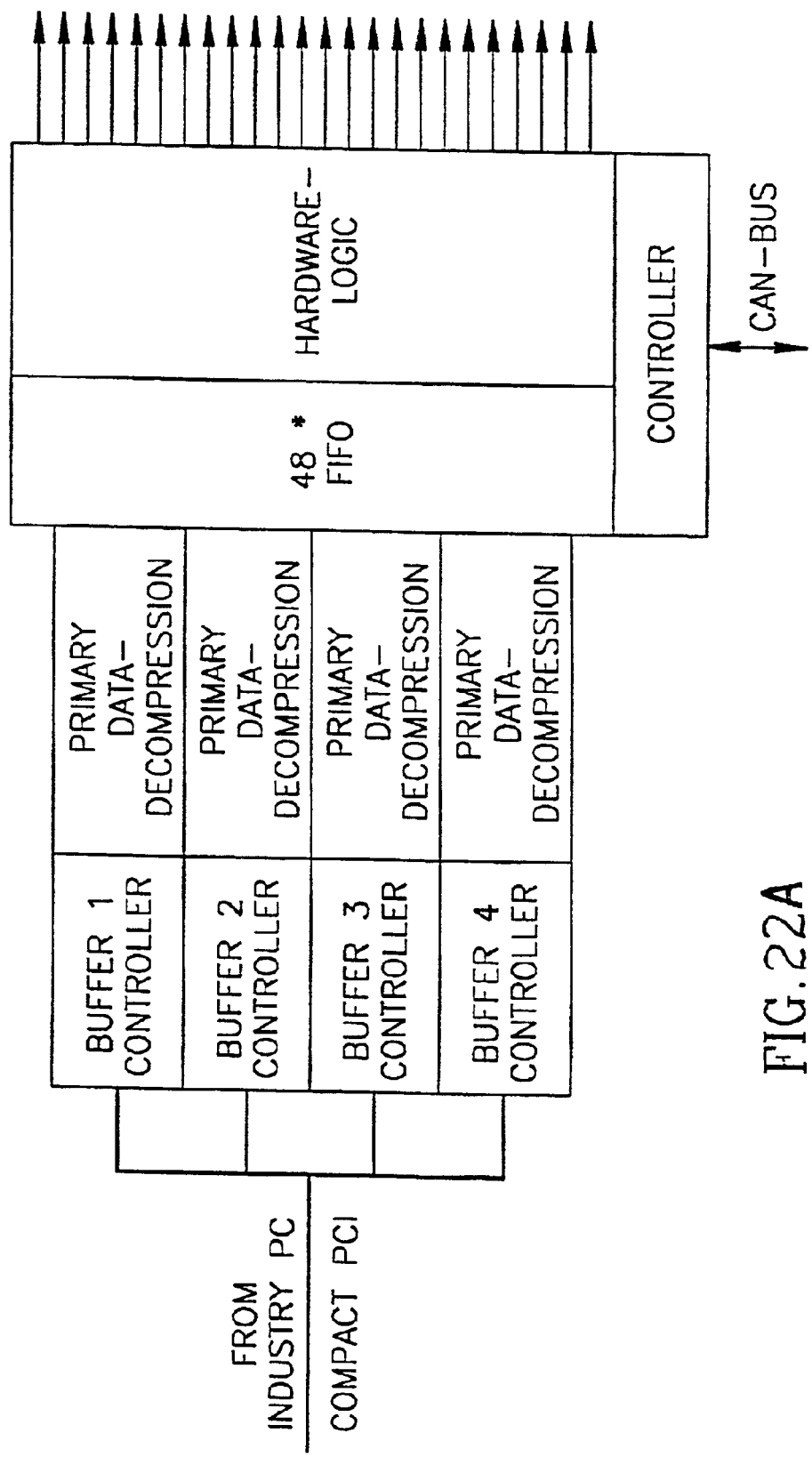
FIG. 22A is an overall block diagram of portions of the system of FIG. 21, in accordance with an exemplary embodiment of the invention.
Figure 22B:
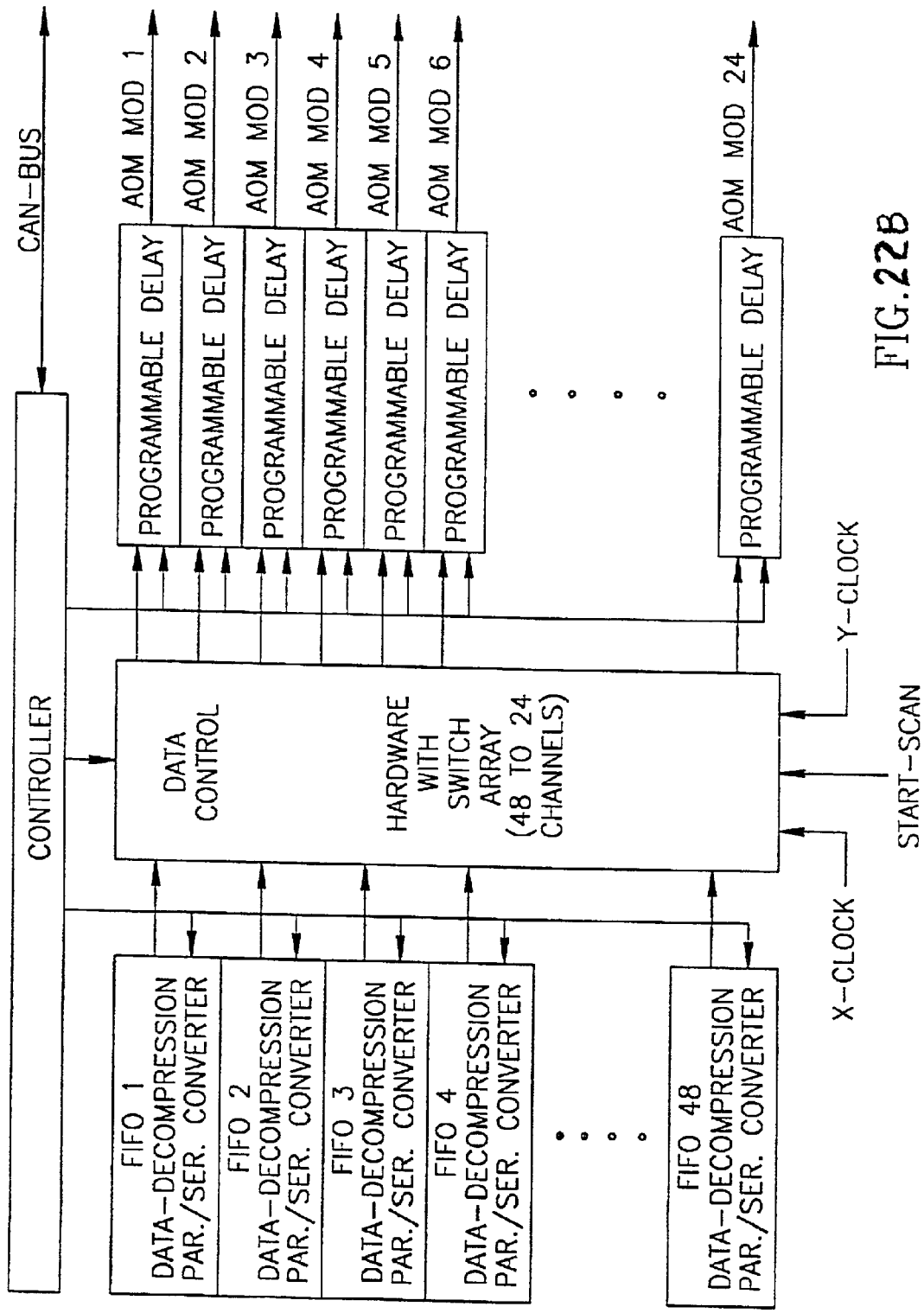
FIG. 22B shows an implementation of hardware logic of FIG. 22A, in accordance with an exemplary embodiment of the invention.
Figure 23:
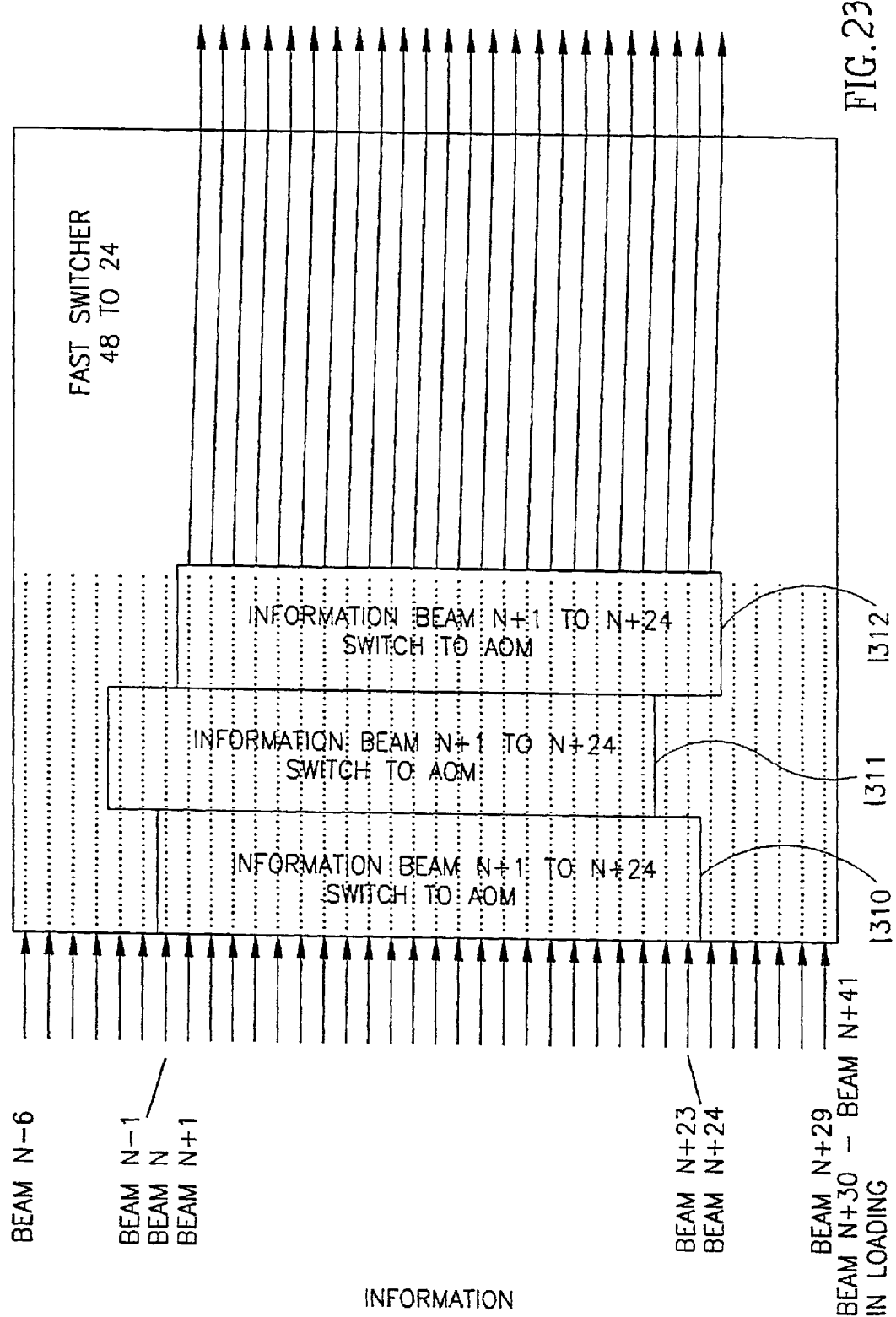
FIG. 23 is a schematic diagram illustrating the operation of a portion of the circuitry of FIG. 22B in which data lines are sent to acousto-optic modulators, based on scan control signals, in accordance with an exemplary embodiment of the invention.

It should be understood that FIG. 21 represents only a functional block diagram and a variety of apparatus and methods for carrying out the functionality of FIG. 21 will occur to persons of skill in the art. Furthermore, some of the functions associated with one of the block may be carried out by another of the blocks or blocks may be combined in practice. Furthermore, all or some of the functions may be carried out in hardware, software or firmware or in combinations of hardware, software or firmware and/or on general or special purpose computers. In general however, for very fast systems, dedicated hardware systems are desirable. Such systems will generally use hardware data decompression, FIFOs for holding the data, switches for switching the data from the FIFOs to the beams and programmable delays for delaying the data based on the position of the printed circuit board. A general view of such a system (for generation of 36 scan lines, only 24 which are actually written to the acousto-optic modulator (AOM) and 12 lines of which are used for the cross scanning correction, described below) is shown in FIG. 22A shows an overall block diagram of buffer/generator 1106 and scan line buffer and control 1108, in accordance with an exemplary embodiment of the invention. FIG. 22B shows an implementation of the hardware logic of FIG. 22A. FIG. 23 illustrates how the fast switcher of FIG. 22B is operative to control which data lines are sent to the AOMs, based on the scan control signals described above. The system allows for up to a 6 scan line offset for the modulator signals in each direction.

It should be noted that the fast switcher shown in FIG. 23 allows for the correction of cross-scan errors that are related to scan position. Such errors may be caused, for example, by residual aberrations in the scanning optics. Such errors do not change with time and can be measured once in the lifetime of the scanner. These errors are stored in a memory and form the basis for signals to the fast switcher.

In particular, FIG. 23 shows 36 data input streams, shown in FIG. 23 as beams entering the switching system and 24 output data streams, each corresponding to a beam modulation channel in modulator 1028, leaving it. (For the system of FIG. 6 of the referenced publication, 30 beams would leave the system.) The incoming data streams correspond to a given scan line on the board according to according to its nominal position. Also shown in FIG. 23 are three boxes 1310–1312 which designate three exemplary "positions" for the switcher. Each box 1310–1312 corresponds to an exemplary cross-scan offset position of the beam on the board for the given scan position, such as may arise due to imperfections in the scan optics. In position 1310, the cross-scan offset is zero. In this case input lines N=0 to N=23 are sent to the modulator. A reference 1311 designates the situation in which the beam is offset by two scan lines in the cross-scan direction. To compensate, input lines N=−2 to N=21 are sent to the modulators so that sub-beams are modulated by data from these input lines. This assures that even though the beam moves in the cross-scan direction during the scan, the information is written in the proper positions on the board. Similarly a reference 1312 represents the situation in which the offset is in the opposite direction by one scan line, such that input lines N=1 to N=24 are sent to the modulator.

Figure 24:
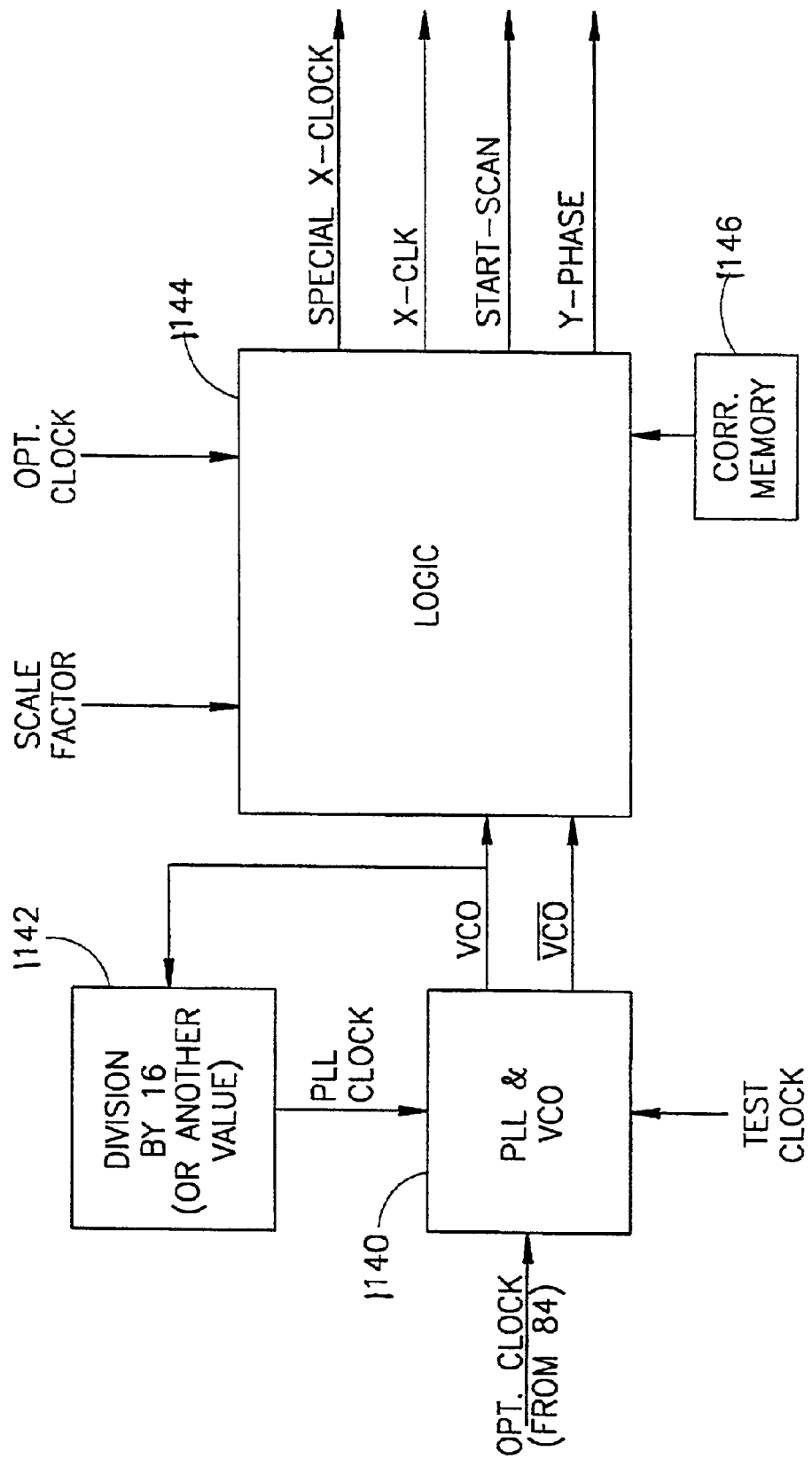
FIG. 24 is a block diagram of apparatus useful for providing a data clock, in accordance with an embodiment of the invention.
Figure 25:
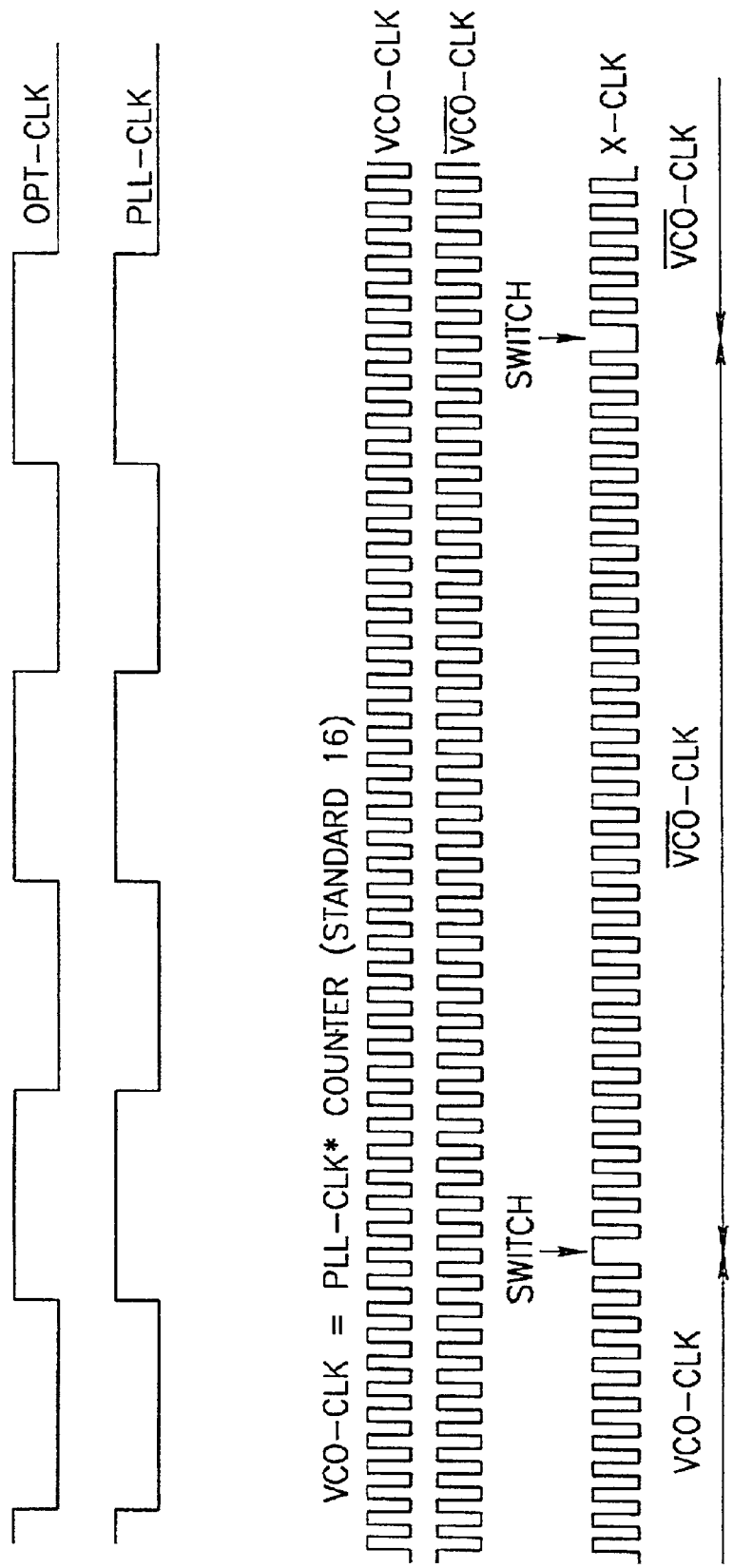
FIG. 25 is a schematic illustration of some clock pulses, useful in understanding the apparatus of FIG. 24.

FIG. 24 is a schematic drawing of clock generator 1102 circuitry for producing the X-clock, that is a clock for accurately determining the position of beams 1016 and 1018 at any of a plurality of locations along the scan axis, in accordance with an exemplary embodiment of the invention. While this circuitry and the method it performs are preferred, it should be understood that other methods of producing a high rate clock from a low rate signal, as known in the art, may be used in other embodiments of the invention. FIG. 25 illustrates clock signals useful in understanding the operation of clock generator 1102. It is thus appreciated that in accordance with exemplary embodiments of the invention, a relatively high pulse rate laser is employed to produce a relatively low pulse rate location signal, the optical clock, which in turn is used to produce and/or to synchronize a high rate clock for accurately determining the position of the pulsed at a multiplicity of locations along the scan axis.

The optical clock signal from detector circuitry 1084 is used to provide a locking signal for a phased locked loop (PLL) and VCO 1140. PLL and VCO 1140 form a loop with a division by 16 circuit 1142 to produce a VCO signal based on a PLL signal which is similar to the optical clock. The PLL clock differs from the optical clock (opt-clock) in the following ways:

1) The PLL-clock is more stable (very short term) than the opt-clock.
2) The PLL clock has sharper and more stable transitions than the opt-clock.
3) The PLL-clock is continuous. The opt-clock disappears during facet switching. When the opt-clock reappears, the PLL locks the PLL clock to the opt-clock. For several cycles a phase difference may exist. However, no data is triggered during this period, as the beam is at the beginning of the scan when no data is yet to be written.

It should be understood that when a pulsed laser is used for beam scanning 1018, the detector signal is pulsed as well. In exemplary embodiments of the invention a detector is used which does not have a high enough frequency response to cleanly pass laser pulses of a mode locked laser, thereby smearing laser pulses in the output signal of the optical clock. However, applicants have surprisingly found that any residual pulse modulation that does remain does not interfere with the locking of the PLL or with the alignment of the test beam as described above. A suitable detector for use in detector circuitry, when the laser pulse rate is 80 MHz is the model s6468 PIN photodiode, available from Hammamatsu.

The PLL and VCO 1140 produces two clocks (VCO and inverse-VCO), both of which are 16 times as fast as the PLL clock and the optical clock. Standard circuitry may be used for this division. Using an AD9850BRS (available from Analog Devices Corp. of USA) to perform the division, other divisions (such as 15,999 or 16.001) can be achieved with a 40 bit accuracy. This makes it possible to generate any required linear scaling.

The VCO clocks are used by logic circuits 1144 to produce the start of scan signal and a Y-phase signal. Logic circuits 1144 also receive a scale factor and scan corrections values from a scan correction memory 1146.

In exemplary embodiments of the invention, the VCO clock as generated by the scale has a slightly higher frequency than the actual desired data stream frequency to the modulators. This built in error and other errors of the system are corrected by a clock generating scheme illustrated in the clock trace of FIG. 25. It will be noted that the signal shown in this line utilizes both the VCO clock and the inverse-VCO clock to form the X-Clock (the data clock). It will be noted that each pair of switches between the clocks results in the loss of a single count. Thus, with the count frequency of the VCO clock set purposely high, it is possible to reduce the frequency, to the extent necessary, to the required frequency. Logic 1144 produces a frequency of switches sufficient to correct for the following:

1) The purposely high VCO frequency caused by scale predistortion. This frequency may be about 0.75% high.
2) A scale factor of the boards.
3) Position errors between the scale measurement and the position of the writing beam. These errors occur primarily because the two beams do not follow the same path and the scanning lens, while telecentric, has some residual non-telecentric errors. Thus, the offset between the beams and the different length of the beams results in some small repeatable errors. The value of these errors is stored in correction memory 1146.

The logic also generates a start scan signal, for example, from the optical clock itself, as described above. This signal is supplemented by a y-phase signal which determines the actual synchronization between the polygon and the y motion of the table.

It should be understood that for simplicity of explanation, other data corrections have not been described. Optionally, however, known errors in the scan readings are taken into account in determining the data sent to the modulator. A further correction is made for a timing delay between the electrical clock based data switching and the impingement of the optical beam on the board. As a result of the timing delay there will be an additional positioning delay in the scanning direction depending for example on the current polygon speed. In an exemplary embodiment of the invention an auto-alignment mechanism based on the position measurement system, as shown in FIG. 26 is used. Details of this system are described in greater detail in WO 00/02424.

At a table position outside of the area of light guide 1152 (FIG. 26), preferably where the board is not under the beam, a data signal is sent at a known X-Clock position. However, delays in the electronic system and especially in the switching time of modulator 1028 will produce modulation at the board, at an offset time from when the data is sent. This results in a positioning offset error at the board. This positioning error is mainly a factor of the polygon speed. To measure the position offset after changing polygon speed, a data signal is sent to the modulator at a first x-position and the light signal from the light pipe is received at a second x-position.

The number of X-Clock pulses between first and second positions now represents a timing delay and is used as an additional delay for X-Clock generator.

It should be understood that several timing delays at several X-Clock positions may be used to provide better accuracy.

The system also optionally includes a test clock used to test the circuitry without having to turn on the laser.

It will be clear to persons skilled in the art, that the scope of the present invention is not limited to the arrangements above described and sketched hereinabove, nor to pulsed UV laser beams.

While the apparatus described in FIGS. 18–26 describes a best mode for providing a pulsed direct writing system, the present invention also applies to other direct laser writing systems, as for example when the wavelength of the test beam is different from that of writing beam. Furthermore, it should be understood that pulsed laser writing systems can have pulse laser rates that are higher then or lower than the data rate.

Furthermore, the aspect of the invention that utilizes a quasi-CW modulation scheme as described above need not operate at UV and certainly need not utilize a frequency doubled laser. In a broad aspect of the invention, any use may be made of such quasi-CW modulated light, as for example scanning a surface or data transmission.

Furthermore, the present invention has been described using non-limiting detailed descriptions of exemplary embodiments thereof that are provided by way of example and that are not intended to limit the scope of the invention. Variations of embodiments of the invention, including combinations of features from the various embodiments will occur to persons of the art. The scope of the invention is thus limited only by the scope of the claims. Furthermore, to avoid any question regarding the scope of the claims, where the terms "comprise," "comprising," "include," "including" or the like are used in the claims, they mean "including but not necessarily limited to".

What is claimed is:

1. Apparatus for scanning a beam across a surface, comprising:
    a scanner that scans a pulsed laser beam across a surface; and
    a position indicator receiving an input from said pulsed laser beam at a plurality of locations across said surface, and outputting position indications indicating a position of said pulsed laser beam along said surface.

2. Apparatus according to claim 1 wherein the surface includes a plurality of spaced markings, such that a modulated pulsed laser beam is reflected from said surface.

3. Apparatus according to claim 2 wherein the position indicator includes a detector, wherein said detector receives said modulated pulsed laser beam and provides a modulated signal.

4. Apparatus according to claim 3 and wherein the response time of said detector is slower than a pulse rate of said pulses, such that said detector outputs a signal that generally does not distinguish said pulses.

5. Apparatus according to claim 1 and including a data modulator modulating a data bearing laser beam in response to said position indications.

6. Apparatus according claim 1 and including:
    a clock generator generating a clock signal; and
    a controller that receives said position indications and controls the clock generator responsive to said position indications.

7. Apparatus according to claim 6 and including a data modulator modulating a data bearing laser beam in response to said clock signal.

8. Apparatus for scanning a beam across a surface, comprising:
    a first beam;
    a modulator that receives said first beam at an input portion thereof, and produces a modulated beam at an exit portion thereof, based on a modulation signal thereto;
    a second beam, said second beam being pulsed;
    a scanner that receives the modulated beam and the second beam and scans the modulated beam in a first beam path across the surface and the second beam along a second beam path substantially parallel to the first beam path;
    a sensor sensing the second beam and periodically indicating a sensed position of said second beam at ones of possible locations in said second beam path; and
    a controller that provides said modulation signal to said modulator at least partially in response to the sensed position of said second beam in said second beam path.

9. Apparatus according to claim 8 wherein the modulation signal is controlled at a data rate and wherein the first and second beams are pulsed at a rate substantially higher than the data rate.

10. Apparatus according to claim 8 wherein the modulation signal is controlled at a data rate and wherein the first and second beams are pulsed at a rate lower than the data rate.

11. Apparatus according to claim 8 wherein the modulation signal is controlled at a data rate and wherein the first and second beams are pulsed at a rate substantially the same as the data rate.

12. Apparatus according to claim 8 wherein the first and second beams have substantially the same wavelengths.

13. Apparatus according to claim 8 wherein the first beam includes energy at a wavelength different from the wavelength of the second beam.

14. Apparatus according to claim 8 and including:
   a marked scale upon which the second pulsed beam impinges, such that the second beam is reflected therefrom to form a modulated reflected pulsed beam.

15. Apparatus according to claim 14 wherein the second beam impinges on the scale at an angle to its surface, such that the modulated reflected pulsed beam is reflected along an axis different from the axis along which the second pulsed beam impinges on the scale.

16. Apparatus according to claim 14 wherein the sensor includes a detector that receives said modulated reflected pulsed beam and generates a modulated signal therefrom, said controller providing said modulation, based on a timing coordinated with said modulated signal.

17. Apparatus according to claim 16 wherein the controller includes:
   a clock generator that receives the modulated signal and generates a timing clock having a clock frequency that is controllably related to the frequency of the modulated signal.

18. Apparatus according to claim 17 wherein the clock generator includes:
   a first generator that generates an intermediate clock and an inverse intermediate clock having the same frequency and inverse phases; and
   switching circuitry having two inputs that receive the intermediate clock and the inverse intermediate clock respectively and a timing clock output to which the clock at one of the two inputs is selectively switched, such that the average frequency of the timing clock at the output is controlled by said selective switching.

19. Apparatus according to claim 18 wherein the switching circuitry switches said inputs to said output responsive to clock correction information.

20. Apparatus according to claim 16, and including:
   a data store containing stored modulation information, which passes said information to said modulator for modulating the first beam, based on timing of said stable clock.

21. Apparatus according to claim 8 wherein the modulated light beam scans over the surface in a first direction and wherein the surface moves in a direction perpendicular to the direction of scanning such that the surface is illuminated by a raster scan.

22. Apparatus according to claim 8 wherein the surface comprises a photosensitive photoresist.

23. Apparatus according to claim 8 wherein the first beam and the second beam each comprise a laser beam.

24. Apparatus according to claim 8 wherein the modulation of the modulated light beam is asynchronous with the pulses of the second pulsed beam.

25. A system for recording a pattern on a substrate, comprising:
   a pulsed laser outputting a pulsed laser beam;
   a modulator that receives the pulsed laser beam and produces a modulated pulsed beam in response to a pixel defining signal;
   a scanner that receives the modulated pulsed beam and scans it across the surface of the substrate to record a pattern defined by pixels on said surface,
   wherein a rise time of the pixel defining signal is less than a pixel period of the pixels.

26. A method for manufacturing electrical circuits, comprising:
   scanning a pulsed laser beam across a marked surface to provide a position modulated pulsed laser beam;
   sensing said position modulated pulsed laser beam and at least partly in response to said sensing outputting position indications indicating a position of said pulsed laser beam on said marked surface;
   scanning a data modulated laser beam across a photosensitized surface formed on an electrical circuit substrate; and
   modulating said data modulated laser beam in response to said position indications to expose said photosensitizes surface according to a predetermined electrical circuit pattern.

27. Apparatus for manufacturing electrical circuits, comprising:
   a scanner scanning a pulsed laser beam across a marked surface to provide a position modulated pulsed laser beam and scanning a data modulated laser beam across a photosensitized surface formed on an electrical circuit substrate;
   a beam position determinator operative to sense said position modulated pulsed laser beam and to output a position indication signal indicating a position of said pulsed laser beam on said marked surface; and
   a modulator modulating said data modulated laser beam at least partly in response to said position indication signal to record a predetermined pattern on said photosensitized surface.

* * * * *